US012708867B2

(12) United States Patent
Gregerson

(10) Patent No.: US 12,708,867 B2
(45) Date of Patent: Aug. 18, 2026

(54) FILTER APPARATUS WITH VENTED CORE, ELECTROSTATIC DISCHARGE MITIGATION, OR BOTH

(71) Applicant: ENTEGRIS, INC., Billerica, MA (US)

(72) Inventor: Barry L. Gregerson, Deephaven, MN (US)

(73) Assignee: ENTEGRIS, INC., Billerica, MA (US)

( * ) Notice: Subject to any disclaimer, the term of this patent is extended or adjusted under 35 U.S.C. 154(b) by 443 days.

(21) Appl. No.: 17/527,870

(22) Filed: Nov. 16, 2021

(65) Prior Publication Data

US 2022/0161196 A1 May 26, 2022

Related U.S. Application Data

(60) Provisional application No. 63/116,444, filed on Nov. 20, 2020.

(51) Int. Cl.
*B01D 29/11* (2006.01)
*B01D 36/00* (2006.01)
*H10P 72/00* (2026.01)

(52) U.S. Cl.
CPC ........ *B01D 29/11* (2013.01); *B01D 2313/041* (2022.08); *B01D 2313/16* (2013.01); (Continued)

(58) Field of Classification Search
CPC ........................... B01D 63/06; B01D 2313/04; B01D 2313/16; B01D 2313/20; B01D 2313/34; B01D 2313/44; B01D 2313/90; B01D 29/114; B01D 36/001; B01D 39/14; B01D 2313/02; B01D 2313/105; B01D 63/063; B01D 65/00; B01D 65/003; B01D 35/30; B01D 2201/291; B01D 2201/302; B01D 2201/50; B01D 29/96; B01D 2201/4023; B01D 2201/4046; B01D 2313/21; B01D 27/08; B01D 35/301; B01D 46/0002; B01D 46/2414; B01D 46/001; B01D 61/02; B01D 61/14; H01L 21/67017; C02F 2201/006; C02F 1/20; C02F 1/444; C02F 1/441; C02F 1/44; C02F 1/442
See application file for complete search history.

(56) References Cited

U.S. PATENT DOCUMENTS

| | | | |
|---|---|---|---|
| 5,154,453 | A | 10/1992 | Nishio |
| 6,409,222 | B1 | 6/2002 | Donoho |

(Continued)

FOREIGN PATENT DOCUMENTS

| | | | |
|---|---|---|---|
| CN | 202366538 | U | 8/2012 |
| CN | 110944734 | A | 3/2020 |

(Continued)

OTHER PUBLICATIONS

English language machine translation of JPH07326570A from J-Plat Pat, 20 Pages, No Date.*

*Primary Examiner* — Pranav N Patel

(57) ABSTRACT

Described are liquid filter apparatuses that include a housing, an interior within the housing, a cartridge assembly (otherwise known as a “filter cartridge”) contained within the housing, and a vent that allows gaseous fluid from an interior of the housing to be released to an exterior of the housing, or that include an electrostatic charge mitigation feature, as well as related methods.

8 Claims, 11 Drawing Sheets

(52) U.S. Cl.
CPC .. *B01D 2313/2061* (2022.08); *B01D 2313/34* (2013.01); *B01D 2313/44* (2013.01); *B01D 2313/62* (2022.08); *B01D 2313/903* (2022.08); *H10P 72/0402* (2026.01)

(56) References Cited

U.S. PATENT DOCUMENTS

| | | | | |
|---|---|---|---|---|
| 6,412,832 | B1 | 7/2002 | Donoho | |
| 6,601,879 | B2 | 8/2003 | Donoho | |
| 6,776,440 | B2 | 8/2004 | Nishio | |
| 6,973,705 | B2 | 12/2005 | Leys | |
| 8,431,023 | B2 | 4/2013 | Berland | |
| 2005/0178707 | A1 | 8/2005 | Girondi | |
| 2009/0001019 | A1 | 1/2009 | Frometa | |
| 2009/0321339 | A1* | 12/2009 | Suzuki | B01D 29/52 210/232 |
| 2011/0062061 | A1 | 3/2011 | Chajec | |
| 2015/0041380 | A1* | 2/2015 | Lin | B01D 35/30 210/188 |
| 2015/0101970 | A1* | 4/2015 | Lin | B01D 46/2414 55/420 |
| 2017/0067426 | A1* | 3/2017 | Da Costa | B01D 36/003 |
| 2017/0304751 | A1* | 10/2017 | Zhibin | B01D 29/114 |
| 2019/0030472 | A1 | 1/2019 | Soma et al. | |
| 2019/0091617 | A1* | 3/2019 | Jaber | B01D 71/32 |
| 2020/0360842 | A1 | 11/2020 | Keskin | |
| 2022/0161196 | A1 | 5/2022 | Gregerson | |

FOREIGN PATENT DOCUMENTS

| | | | |
|---|---|---|---|
| CN | 211088084 | U | 7/2020 |
| CN | 211318997 | U | 8/2020 |
| CN | 211463197 | U | 9/2020 |
| JP | H07326570 | A | 12/1995 |
| JP | 11253933 | A | 9/1999 |
| JP | 2003210912 | A | 7/2003 |
| JP | 2020167001 | A | 10/2020 |
| KR | 20130002659 | A | 1/2013 |
| KR | 20180078371 | A | 7/2018 |

* cited by examiner 32
41
60
86
36
76
74
46
58
81
77
42
54
48
81
84
52
88
44
46
80
83
56
82
80

102
126
46
44
88
46
58
81
77
127
110
54
106
81
84
86
80
83
56
60
82
80

FILTER APPARATUS WITH VENTED CORE, ELECTROSTATIC DISCHARGE MITIGATION, OR BOTH

This application claims the benefit under 35 USC 119 of U.S. Provisional Patent Application No. 63/116,444, filed Nov. 20, 2020, the disclosure of which is hereby incorporated herein by reference in its entirety.

FIELD

The invention relates to liquid filter apparatuses that include a housing, an interior within the housing, a cartridge assembly (otherwise known as a "filter cartridge") contained within the housing, as well as a vent that allows gaseous fluid from an interior of the housing to be released to an exterior of the housing, an electrostatic discharge feature, or both a vent and an electrostatic discharge feature.

BACKGROUND

Liquid filtration systems allow for the preparation and control of flows of purified, e.g., high purity, liquids. These systems have a broad range of uses, including uses in chemical processing and manufacturing industries for pharmaceuticals, food processing and packaging, industrial and commercial chemicals and chemical products, and for processing liquids for use in semiconductor and microelectronic processing. For semiconductor and microelectronic processing, liquid filtration systems are used for filtering liquids used to manufacture solar panels, flat panel displays, and semiconductor and microelectronic devices. The liquids may be used in a process such as photolithography, bulk chemical delivery, chemical mechanical processing (CMP), wet etching, or cleaning, among other types of processes.

Various designs of filter assemblies used for processing (filtering) liquids include a multiple piece filter housing that defines an interior that contains a filter membrane that removes impurities from the liquid as liquid passes through the membrane. In use, liquid is caused to flow through the interior in a flow path that includes flow through the filter membrane. The filter membrane is a component of a replaceable filter cartridge (or "cartridge assembly") that can be removed from the housing and replaced after a period of use.

The housing of such a filter apparatus typically includes two main outer structures: a manifold and a bowl. The manifold includes a fluid inlet through which fluid (unfiltered liquid) passes to enter the filter housing, and a fluid outlet through which fluid (filtrate) passes to exit the filter apparatus after passing through the filter membrane. Between the inlet and the outlet, the fluid must pass through the porous filter membrane. The filter membrane is supported by the replaceable filter cartridge, which is contained in the housing. The bowl includes an open end that engages the manifold and forms a liquid-tight seal between the manifold and the bowl.

A standard installed arrangement of this type of filter apparatus is with a manifold connected to an input conduit and an output conduit. The input conduit is connected to the manifold inlet, which directs an incoming flow of unfiltered liquid into the housing. The output conduit is connected to the manifold outlet to receive a flow of fluid (i.e., a "filtrate") that exits the assembly through the manifold output after the fluid has passed through the filter membrane.

Standard installed arrangements of such filter housing assemblies are designed to be mounted with the bowl extending vertically downward below the manifold. This arrangement is often referred to as a standard or "bowl-down" configuration. When mounted this way, with the manifold situated above the housing bowl, a vent port may be included in the manifold, and may be selectively opened to release air or other gas that accumulates within the filter apparatus at an upper portion of the housing, to an exterior location. At start up or during use, with example filter assemblies, when filtering a liquid fluid, a volume of gas (e.g., air) may accumulate at an inner space of the filter cartridge, e.g., at an inner core volume located within a central channel of the filter cartridge contained within the housing. This gas may be removed using the vent.

In certain applications, for example for use of these filter apparatuses by semiconductor manufacturers, a more preferred installed arrangement may be with the cartridge assembly and the bowl of the housing being located above the manifold in an inverted, or "bowl-up" configuration. A bowl-up configuration has advantages, but also challenges that stem from the different orientation. The bowl-up orientation allows plumbing (an inlet conduit and an outlet conduit) that connects to the manifold to be located at a lower portion or a bottom of the filter apparatus, in line with the manifold and below the bowl and the filter cartridge. This may be preferred because this arrangement positions the bowl and the cartridge assembly at a more accessible location, above the manifold, and can also result in more efficient drainage of the filter during a filter replacement step.

However, a bowl-up orientation renders a venting feature through the manifold non-operational because the vent is located at the bottom of the filter apparatus, and gaseous fluid that accumulates within the housing, e.g., within the inner space of the filter cartridge (i.e., a "cartridge core volume," or "core volume" for short), can accumulate at the top of the filter apparatus, i.e., at the top of the bowl.

A venting feature of a liquid filtering apparatus can be important for at least two significant reasons. One reason is to prevent reduced performance of the filtering apparatus due to the presence of a gas pocket within the filter housing during use. A second (not entirely unrelated) reason is to prevent the risk of electrostatic discharge.

Regarding the former, if an interior of a housing of a liquid filtering apparatus contains a pocket of trapped air or another gaseous fluid, the liquid that is passing through the housing will not contact the entire area of the filtration membrane, and the membrane will become de-wetted. De-wetting may be a concern with different types of filter membranes, such as hydrophobic filter membrane.

The second concern is electrostatic discharge. Filter housings, structures and components of the housing are typically made of chemically resistant polymeric materials, which are non-conductive (insulative). If a liquid that is passing through the filter housing also has low electrical conductivity, significant electrostatic charge can build up within the fluid, the filter housing, or a component or structure thereof. The charge build-up creates a risk of electrostatic discharge. A volume of trapped air at an upper region of a liquid filter apparatus housing causes turbulent flow or free falling of the liquid flowing through the filter housing, which can cause a buildup of electrostatic charge within the liquid, filter apparatus, structures or housing.

In more detail, buildup of electrostatic charge in a filtering system can occur due to frictional contact between a flow of liquid through a filtering system, and surfaces of the filtering system (e.g. tubing, conduits, piping, valves, fittings, filter housings, and filter cartridges, etc.). Charge build can be increased by uneven or turbulent flow of liquid through a filter housing caused by a volume of gas in the filter housing, particularly gas located at the core volume located at the interior of the filter cartridge assembly. The magnitude of a charge buildup will be affected by factors such as the nature (e.g., chemical composition) of the housing, the type and composition of the liquid that passes through the housing, the velocity of the liquid, viscosity of the liquid, electrical conductivity of the liquid, pathways to ground, turbulence and shear in the liquid, the presence and location of air in the fluid of fluid handling system (e.g. filter apparatus), and the size of a contact area between the fluid and fluid handling components.

Further, as fluid flows through a fluid handling system, the charge can be carried downstream in a phenomenon called a streaming charge, whereby electrical charge may build at a location that is different from the location at which the charge originates. A sufficient amount of charge accumulation can cause electrostatic discharge at a structure of a component of a fluid handling system, e.g., filter apparatus. Potentially, however, the discharge may occur at a different location that is connected to the fluid handling system, such as at processing equipment (e.g., a semiconductor manufacturing tool) connected to and supplied by the fluid handling system.

Semiconductor and microelectronic device substrates can be highly sensitive to static electrical charges. Electrostatic discharge that involves a semiconductor or microelectronic device substrate can result in damage to or destruction of the substrate. For example, circuits on the substrate can be destroyed and photoactive compounds can be activated prior to regular exposure due to uncontrolled electrostatic discharge. Additionally, built up static charge can discharge from within a fluid handling system to an exterior environment, potentially damaging components of the fluid handling system (e.g. tubing or piping, fittings, components, containers, filters, etc.), possibly resulting in damage to the fluid handling system that could be the cause of a leak, spills of fluid in the system, or diminished performance. In some environments discharge, may lead to potential fire, explosion, or safety hazard if a fluid handled by the system is flammable, toxic, or corrosive.

In some fluid handling systems, to reduce the buildup of static charges, certain metal or conductive components are used to connect the system to electrical ground to mitigate the buildup of static charge in the system. Conventional use of multiple grounding straps may lead to undue mechanical clutter in a fluid handling system, and may lead to a complex grounding system network requiring extensive maintenance or a complex system that may be susceptible to failure.

It would be desirable to improve electrostatic mitigation systems and techniques in fluid handling systems, including filter apparatuses, for improved performance and to reduce the risk of potentially damaging electrostatic discharge events.

SUMMARY

The present disclosure, in certain respects, provides filtering apparatuses that include improved venting features, particularly with respect to venting a gaseous fluid from an inner core volume within a filter cartridge of a liquid filtering apparatus, during use of an apparatus installed in a bowl-up configuration.

Also according to certain example embodiments, a liquid filtering apparatus can alternately or additionally include a electrostatic charge-dissipation feature, also referred to as an ESD mitigation feature. The ESD mitigation feature may be incorporated into the apparatus by constructing any one or more components of the apparatus of electrically conductive material, e.g., conductive polymer or conductive fluoropolymer. In example apparatuses, a vent feature or other component of a housing can be made of conductive material such as electrically conductive polymers or hybrid conductive/non-conductive polymer structures. When present, the electrically conductive structure, such as a vent tube, is coupled to the housing, and eventually to electrical ground to mitigate the risk of ESD. In some embodiments, a conductive fitting extending through an insulative polymer manifold completes a circuit from the electrical path within the filter core to ground (e.g., an electrical connection can be made between the vent tube and ground).

In one aspect, the invention relates to a liquid filtering apparatus. The apparatus includes: a bowl that includes an open end, a distal end opposite of the open end, and an interior that extends between the open end and the distal end; a manifold that is capable of sealingly engaging the open end of the bowl, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the bowl; and a vent extending through the manifold to a distal portion of the core to fluidly connect the distal portion of the core volume with an exterior of the liquid filtering apparatus.

In another aspect, the invention relates to a method of filtering a liquid using a liquid filtering apparatus that includes a housing that includes a manifold and a bowl, with the bowl situated vertically above the manifold. The housing includes: the bowl, which comprises an open end, a distal end opposite of the open end, and an interior that extends between the open end and the distal end; the manifold, which is engaged with the open end of the bowl to form a manifold-bowl seal, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the bowl; and a vent extending through the manifold to a distal portion of the core volume to fluidly connect the distal portion of the core volume with an exterior of the bowl. The method includes: passing liquid through the apparatus by passing the liquid in the inlet, from the inlet through the housing volume, through the filter membrane, to the core volume, and then through the outlet, wherein gas accumulates at the distal portion of the core volume; and releasing the gas through the vent.

In another aspect, the method relates to a method of replacing a cartridge assembly of a liquid filtering apparatus comprising a housing that includes a manifold and a bowl, with the bowl situated vertically above the manifold. The housing comprising: the bowl, which comprises an open end, a distal end opposite of the open end, and an interior that extends between the open end and the distal end; the manifold, which is engaged with the open end of the bowl to form a manifold-bowl seal, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the bowl, and a vent that extends through the manifold to a distal portion of the core volume to fluidly connect the distal portion of the core volume with an exterior of the housing. The method includes: draining liquid fluid from the liquid filtering apparatus; disassembling the manifold-bowl seal; vertically lifting the bowl and the cartridge assembly above the manifold to produce vertical clearance between the bowl and the manifold, and between the cartridge assembly and the manifold; and moving the bowl and the cartridge assembly together laterally to produce clearance between the manifold and the bowl, and between the manifold and the cartridge assembly.

In yet another aspect, the invention relates to a liquid filtering apparatus that includes: a bowl comprising an open end, a distal end opposite of the open end, and an interior that extends between the open end and the distal end; a manifold that is capable of sealingly engaging the open end of the bowl, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; and an electrostatic discharge mitigation feature that comprises conductive polymer, that is capable of conducting electrical charge through a grounded circuit to inhibit accumulation of electrostatic charge within the apparatus.

Figure 2:
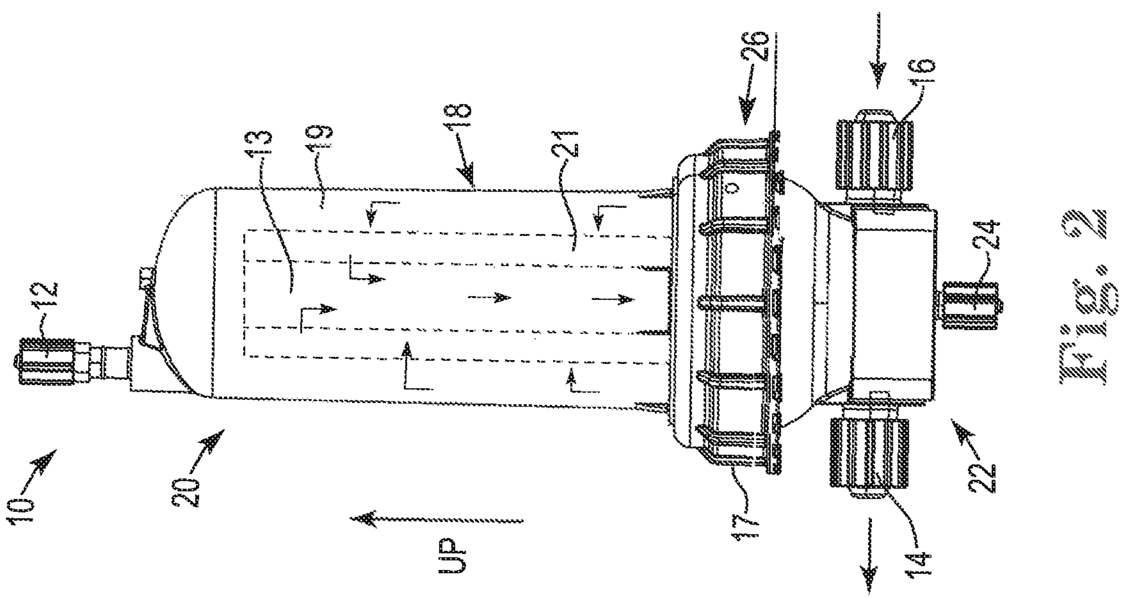
FIG. 2 shows a filter apparatus in a bowl-up configuration.

The Figures are schematic, and not necessarily drawn to scale.

DETAILED DESCRIPTION

The present description relates to novel and inventive systems that involve improvements to liquid filtering apparatuses. In certain particular non-limiting examples, the description relates to liquid filtering apparatuses that may be operated in a bowl-up orientation, and that include a venting feature that extends through the bowl, for venting a core volume within the interior of the liquid filtering apparatus.

This description also relates to liquid filtering apparatuses that alternately or additionally incorporate a system for mitigating electrostatic charge buildup in a liquid filtering apparatus, to mitigate the risk of electrostatic discharge (ESD) from the filter apparatus or a connected flow control apparatus or other type of apparatus.

A liquid filtering apparatus as described is of a type that includes a housing (sometimes referred to as a “filter housing”) that includes both a manifold and a bowl. The bowl has a structure that includes an open end and a distal end opposite of the open end. Between the open end and the distal end, the bowl includes a sidewall structure that also defines an interior of the bowl situated between the open end, the sidewalls, and the distal end. The “open” end refers to an end that includes an aperture or opening through which a cartridge assembly can couple, to place the cartridge assembly within the interior.

The bowl distal end is substantially closed with the exception of one or multiple vent passages through the distal end. For use of the liquid filtering apparatus in a “bowl-up” configuration, the distal end of the bowl may include an opening that allows for venting between an exterior side of the distal end and a core volume. Alternately, or additionally, the distal end of the bowl may include an opening that allows for venting between an exterior side of the distal end and a housing volume.

The housing also includes a manifold that opposed and engages the open end of the bowl to form a liquid-tight seal between the open end of the bowl and the manifold. The engagement may include a threaded engagement, a gasket, a clamp, or any other mechanical fastening engagement that will provide a liquid-tight seal between the manifold and the open end of the bowl, referred to as the “manifold-bowl seal.”

When engaged with the open end of the bowl, the manifold covers the open end of the bowl to fill and close the opening and to cover the interior of the bowl. The bowl communicates with an exterior space through openings or passages in the manifold in the form of an inlet and an outlet, each of which is part of the manifold structure. The manifold inlet allows fluid (unfiltered liquid) to flow through the manifold from an exterior source and into an interior space of the housing, which may be either the filter cartridge core volume or the housing volume. The manifold also includes an outlet, which is a passage through the manifold that allows liquid to pass out of the housing, either from the core volume to a location that is exterior to the housing, or from the open side space to a location that is exterior to the housing.

The housing interior is configured to contain a cartridge assembly that contains a porous filter membrane through which unfiltered liquid that enters the housing through the inlet must flow while passing through the filtering apparatus.

The cartridge assembly may be any structure that supports a filter membrane for use in a filter housing of a liquid filtration apparatus. Often, or typically, the cartridge assembly contains an annular, typically cylindrical, support structure that includes opposed ends that include a proximal end (or "cartridge assembly proximal end") and a distal end (or "cartridge assembly distal end"). The filter membrane is held and supported by support structure, and sealed between the two opposed ends, and in a location that, with the cartridge assembly installed within the assembled housing, liquid that enters into the housing through the housing inlet must pass through the filter membrane for the liquid to subsequently pass through housing outlet.

The cartridge assembly can be considered to include an axis (e.g., a central axis) that extends along the length of the cartridge assembly along a center or medial location between the two opposed ends. The cartridge assembly also defines an open space at the central interior of the annular or cylindrical cartridge assembly, facing a core side of the filter membrane. The open space extends between the two opposed ends of the cartridge assembly and includes the central axis. This open space is referred to as the "core volume" of the cartridge assembly, is located on one side (the interior, central, or "core" side) of the filter membrane, and extends between the core side of the filter membrane and one or the other of the housing inlet or the housing outlet (typically, the housing outlet).

The cartridge assembly includes a second side, i.e., a housing side, that is opposite of the core side, that faces the housing bowl when the cartridge assembly is installed in an assembled filter housing. The cartridge assembly and housing define a second open space at the interior of the annular cartridge assembly, which is referred to as the "housing volume," and which is located between interior surfaces of the housing bowl, and the housing side of the cartridge assembly, also the housing side of the filter membrane. This housing volume extends between the housing side of the filter membrane, interior surfaces of the housing bowl, and one of the housing inlet or the housing outlet (typically the inlet).

The cartridge assembly proximal end is configured to engage the manifold and to produce a liquid-tight seal between the manifold and the cartridge assembly proximal end, i.e., a "cartridge assembly-manifold seal." The cartridge assembly-manifold seal provides a liquid-tight flow path between the core volume and the manifold, to allow liquid to flow between the core volume and the manifold and through either at the housing inlet or the housing outlet.

The cartridge assembly-manifold seal can be of any useful design that will provide a sealed flow path between the manifold and the cartridge assembly proximal end. Examples include threaded engagements, snap-fit engagements, and press-engagements.

For ease of removal of the cartridge assembly from the manifold during a step of replacing the cartridge assembly, a preferred engagement between the cartridge assembly proximal end and the manifold, to form the cartridge assembly-manifold seal, may be a sealed engagement that is a press-fit engagement. With this type of engagement, the cartridge assembly-manifold seal can be formed by pressing a surface of the cartridge assembly proximal end into contact with a surface of the manifold, with movement of the cartridge assembly along the central axis toward the manifold, e.g., exclusively along the direction of the axis and without rotation of the cartridge assembly relative to the central axis. Typically, the cartridge assembly proximal end includes a cylindrical outward-facing surface that aligns with and extends along the direction of the central axis of the cartridge assembly. The manifold includes an opening that defines an opposed surface that is adapted to engage the cylindrical surface of the cartridge assembly proximal end. One or more gaskets, e.g., "O-ring" type gaskets, are disposed between the opposed surfaces of the manifold and the proximal end, to form a liquid-tight seal.

The sealed engagement can be produced by pressing the proximal end into the opening of the manifold to align the two opposed surfaces, with the one or more gaskets contacting both of the opposed surfaces. When the housing is installed in a bowl-up configuration, this includes pressing the cartridge assembly in a vertically downward direction along the central axis of the cartridge assembly toward an upper face of the manifold. The sealed engagement can be disassembled by pulling the cartridge assembly proximal end surface from the surface of the manifold. When the housing is installed in a bowl-up configuration, this includes lifting the cartridge assembly in a vertically upward direction along the central axis of the cartridge assembly, away from the upper face of the manifold.

Examples of useful and preferred housing designs include a venting feature that allows venting of (removal of) a gaseous fluid from a location within the filter cartridge core volume to a location that is exterior to the housing. During use of a liquid filtering apparatus as described in a bowl-up configuration, e.g., with flow of liquid through the filter membrane in a direction from the housing volume (connected to the housing inlet) to the core volume (connected to the housing outlet), air or other gaseous fluid may collect in the upper portion of the core volume, which is also a "distal portion" of the core volume. The "upper portion" refers to the upper quarter, third, or half of the core volume when the housing is installed in a bowl-up configuration, which is also the portion of the core volume that is located at the distal end of the housing and away from the manifold. In a consistent manner, the "distal portion" refers to the quarter, third, or half of the core volume that is located at the distal end of the core, which is the end that is located proximal to the distal end of the bowl and away from the open end of the bowl.

According to example housing structures as described, the housing in conjunction with the cartridge assembly include a venting feature that allows for fluid communication between the core volume, e.g., the upper portion (distal portion) of the core volume, and the housing exterior, to allow for removal of gaseous fluid from the core volume that may accumulate there during use of the liquid filtering apparatus.

The venting feature may include any structure that provides fluid communication between the core volume and the housing exterior. Examples include a tube, conduit, channel or other passage that that extends between the core volume and the housing exterior, and that can be used to allow gas to pass from the core volume to escape the core volume and flow to an exterior location. The venting structure may be in the form of a single integral piece, or may be an assembly of two or more pieces that together form a continuous fluidic flow path between the core volume and the housing exterior. The venting structure may be independent and separable from the structures of the housing (e.g., the manifold and the bowl), and from the cartridge assembly. Alternately, the venting structure may part of or attached during use to the housing bowl, to the housing manifold, or to the cartridge assembly, to remain with one of these different structures during a step of replacing the cartridge assembly.

A core venting feature may be located at the proximal end of the housing and incorporated into the housing manifold, or may alternately be at the distal end of the housing and incorporated into the distal end of the housing bowl. Optionally, as part of the latter configuration, an apparatus as described can include a fluid tight seal between an inner surface of the housing bowl and the cartridge assembly, this seal being referred to as a "cartridge assembly-bowl seal."

A cartridge assembly-bowl seal can be of any useful design that will provide a liquid-tight passage between an inner surface of the bowl and the cartridge assembly distal end. Examples include opposed threaded engagements, snap-fit engagements, and press-fit engagements. One example of a useful engagement between the cartridge assembly distal end and an inner surface of the bowl, to form the cartridge assembly bowl seal, is a sealed engagement that is a press-fit engagement as described herein for use to form a cartridge assembly-bowl seal. With this type of engagement, the cartridge assembly-bowl seal can be formed by pressing a surface of the cartridge assembly distal end into contact with an inner surface of the bowl, with movement of the cartridge assembly along the central axis toward the distal end of the bowl. Typically, the cartridge assembly distal end may include a cylindrical outward-facing surface that aligns with and extends along the direction of the central axis of the cartridge assembly. The inner surface of the bowl includes an opening that defines an opposed surface that is adapted to engage the cylindrical surface of the cartridge assembly distal end. One or more gaskets, e.g., "O-ring" type gaskets, are disposed between the opposed surfaces of the bowl and the distal end to form a liquid-tight seal between the two opposed surfaces.

The sealed engagement can be produced by pressing the distal end into the opening to align the opposed surfaces, with movement of the cartridge assembly along the central axis toward the distal end of the bowl housing, and with the one or more gaskets contacting both of the opposed surfaces. The sealed engagement can be disassembled by pulling the cartridge assembly distal end surface away from the surface of the bowl, with movement of the cartridge assembly along the central axis and away from the distal end of the bowl.

Alternately or in addition to a core venting feature, example liquid filtering apparatuses can include an ESD mitigation feature, which is a structure that mitigates the build of electrostatic charge in the housing and components thereof, to mitigate the risk of a charge buildup that would be sufficient to result in an electrostatic discharge to electrical ground. According to certain (non-exclusive) examples of these features, an ESD mitigation feature can be included as part of a venting feature, e.g., a core vent feature. Accordingly, the ESD mitigation feature can be placed at a location of a potential accumulation of gas at an upper portion of a core volume, which is a location at which electrostatic charge could originate.

Oftentimes, depending on the expected use of a liquid filtering apparatus, structures of the apparatus (e.g., bowl, manifold, components of the cartridge assembly, adjacent valves and flow conduits, etc.) are made of inert polymers that are specifically resistant to chemical degradation such as oxidation or corrosion. To meet corrosion resistance and purity requirements for such applications, liquid filtering apparatus components such as tubing, fittings, valves, conduits, housings, cartridge assemblies, and other items, are made from inert polymers. Examples of useful inert polymers include fluoropolymers such as tetrafluoroethylene polymer (PTFE), perfluoroalkoxy alkane polymer (PFA), ethylene and tetrafluoroethylene polymer (ETFE), ethylene, tetrafluoroethylene and hexafluoropropylene polymer (EFEP), and fluorinated ethylene propylene polymer (FEP). In addition to providing a non-corrosive and inert construction, many fluoropolymers, such as PFA, are injection moldable and extrudable. Other polymers such as PP and HDPE may also be useful, depending on the application. Several types of connector fittings, made from such polymers, are available and are known, such as PRIMELOCK® fittings, PILLAR® fittings, flared fittings, and other fittings. Exemplary fittings, for example, are illustrated in U.S. Pat. Nos. 5,154,453; 6,409,222; 6,412,832; 6,601,879; 6,758,104; and 6,776,440. These types of inert polymers, however, typically exhibit a low electrical conductivity or insulative, which causes these materials and components made from them to be susceptible to the accumulation of electrostatic charge. Therefore, as described, a filter housing of the present description can include an ESD mitigation feature.

An ESD mitigation feature is a structure or portion of a structure of a housing (including a cartridge assembly) as described that prevents or minimizes the accumulation of electrostatic charge within the fluid or the housing, or removes or dissipates a generated or accumulated charge from a structure of the housing. An ESD mitigation feature can include a conductive element of a structure of the housing, such as a conductive component of a vent feature (e.g., a vent conduit or portion thereof), a conductive component of the housing bowl, a conductive component of the housing manifold, a conductive component of the cartridge assembly, etc.

The conductive component may be made of a material that is consistent with other materials of the housing, for example that may be inert. Examples include conductive polymers, especially conductive fluoropolymers. A conductive fluoropolymer may be based on non-conductive fluoropolymer that is formulated to include conductive material that causes the fluoropolymer to be sufficiently electrically conductive to be effective as part of an ESD feature. Example of such fluoropolymers include perfluoroalkoxy alkane polymer (PFA), ethylene and tetrafluoroethylene polymer (ETFE), ethylene tetrafluoroethylene and hexafluoropropylene polymer (EFEP), fluorinated ethylene propylene polymer (FEP), tetrafluoroethylene polymer (PTFE), as well as other suitable polymeric materials. Examples conductive fluoropolymers include PFA that has been combined with ("loaded" with) conductive material (e.g. loaded PFA). This loaded PFA includes, but is not limited to, PFA loaded with carbon fiber, nickel coated graphite, carbon fiber, carbon powder, carbon nanotubes, metal particles, and steel fiber. In various embodiments, a conductive component of an ESD mitigation feature can have an electrical resistivity that is level less than about $1\times10^6$ ohm-m, while materials that are considered to be non-conductive have a resistivity level greater than about $1\times10^6$ ohm-m. In certain embodiments, conductive components of an ESD mitigation feature have a resistivity that is below about $1\times10^6$ ohm-m, while materials that are considered to be non-conductive have a resistivity level greater than about $1\times10^6$ ohm-m.

Figure 1:
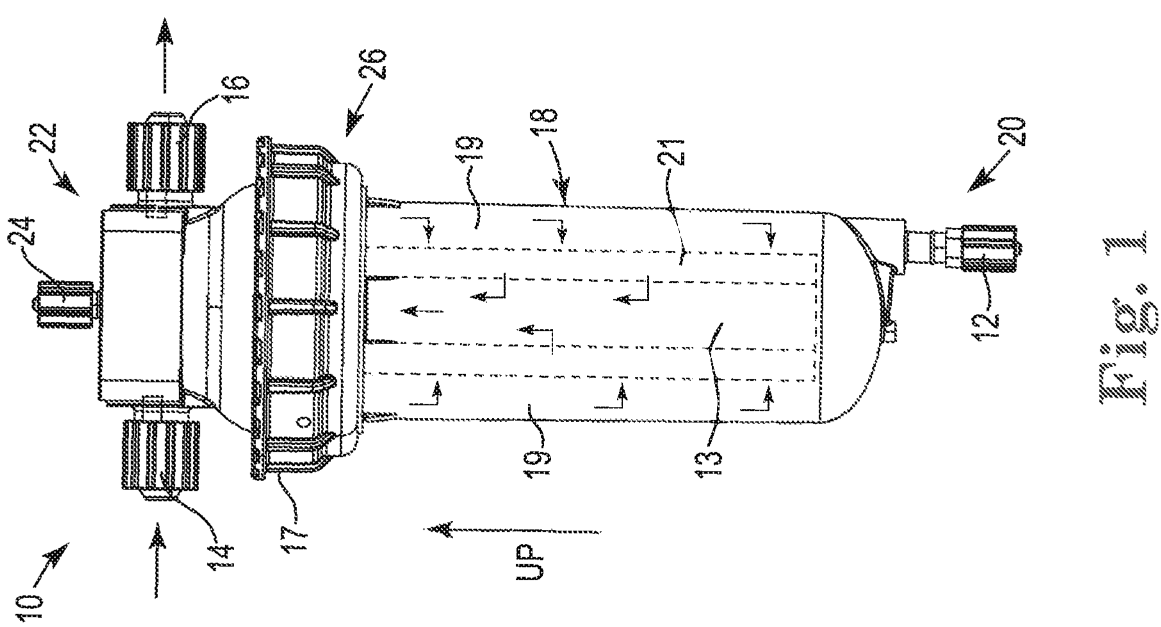
FIG. 1 shows a filter apparatus in a bowl-down configuration.

Referring now to the Figures, FIG. 1 shows a liquid filtering apparatus 10 installed in a bowl-down configuration, and that may include or may be adapted to include one or features as described herein, such as a venting feature as described, an ESD mitigation feature as described, or both. Assembly 10 includes a housing that includes housing manifold 22 and housing bowl 18. Housing bowl 18 includes distal end 20, which is located at the bottom or lower end of assembly 10 as illustrated, and open end 17, which is located at a top of bowl 18 as illustrated (in a "bowl-down" orientation) and is engaged with manifold 22. Bowl 18 is removably attached to manifold 22 at manifold-bowl seal 26, which may be a threadable engagement or another type of liquid-tight sealing engagement.

The assembled housing includes an interior at which a cartridge assembly 21 is held. Liquid to be filtered ("unfiltered liquid") enters assembly 10 at inlet 14 and is caused to follow a flow path that includes passing through inlet 14 of manifold 22, then through a filter membrane (not shown) that is supported by cartridge assembly 21, and subsequently exiting assembly 10 at outlet 16 (see arrows indicating an exemplary flow path of liquid through assembly 10). Relative to cartridge assembly 21 and bowl 18, the interior of the housing includes a core volume 13 on a core side of cartridge assembly 21 and its filter membrane, and housing volume 19 on a housing side of cartridge assembly 21 and its associated filter membrane. One or more vents can provide a path for a fluid (such as gas) to be released from the interior of the assembly on either side of the filter membrane (e.g., on a housing space side of the membrane or a core volume side of the membrane), before or after passing through the filter membrane. As shown at FIG. 1, housing vent 12 is located at distal end 20 end of bowl 18, and a core vent 24 is included as part of manifold 22. Housing vent 12 allows for fluid communication between housing volume 19 and a location exterior to the housing. Core vent 24 allows for fluid communication between core volume 13 and a location exterior to the housing.

While not specifically, shown, assembly 10 of FIG. 1 may include a feature of the present description such as an ESD mitigation device. The ESD mitigation device may include a conductive component of the housing that is part of a static charge-reducing electrical circuit that extends from the housing to ground. The conductive component may be any one or more of the housing bowl, cartridge assembly, manifold, or appurtenant valves, connectors, or fittings, made entirely or in part of conductive polymer, e.g., conductive fluoropolymer.

FIG. 2 shows liquid filtering apparatus 10 in an alternate bowl-up configuration. As shown, apparatus 10 has substantially the same features of filter apparatus 10 of FIG. 1 in the bowl-down configuration, but in a vertically inverted with bowl housing 18 located above manifold 18, and with distal end 20 of bowl 18 being locate above open end 17 of bowl 18.

Challenges arise from the bowl-up configuration of FIG. 2. For example, although not shown, a volume of a gas phase (e.g., air) may accumulate at an upper portion of core volume 13 during use of assembly to filter a liquid. Such a volume of accumulated gas at core volume 13 cannot be removed from assembly 10 through either of vent 20 or vent 24.

Alternately or additionally, core assembly 13, bowl housing 18, or both, may accumulate electrostatic charge during use of assembly 10 to filter a liquid passing through assembly 10, especially upon accumulation of a volume of gas (e.g., air) at an upper portion of core volume 13. Therefore, improved venting of the filter apparatus 10 when oriented in a bowl-up configuration, and in particularly of a core volume within the apparatus, would be beneficial. Improved electrostatic discharge (ESD) mitigation as electric charge is accumulated during liquid filtering would also be beneficial in a filter apparatus such as filter apparatus 10 of FIG. 2.

Figure 3:
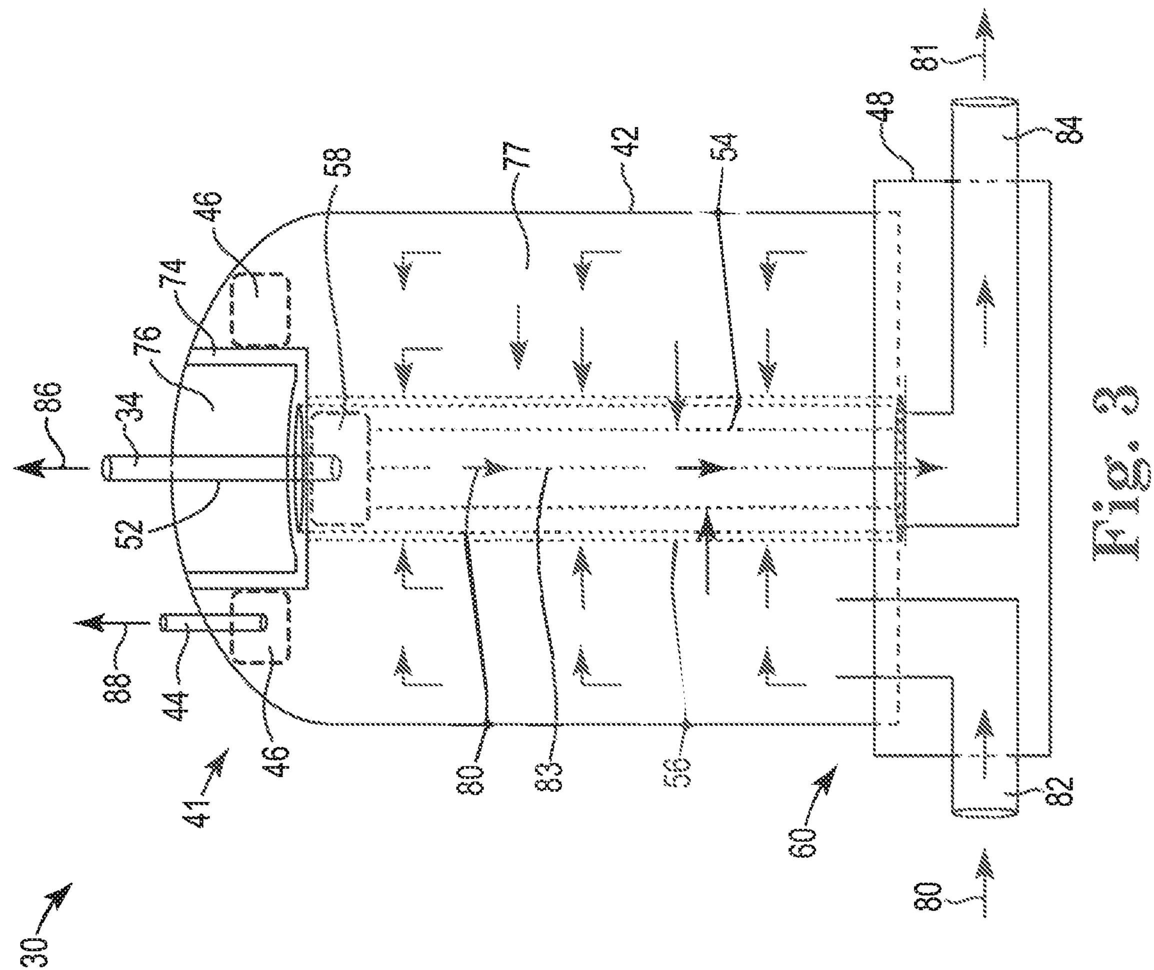
FIG. 3 is a schematic view of a filter apparatus in a bowl-up configuration with a core vent passing through a distal end of a filter housing.

Illustrated in FIG. 3 is an example of a liquid filtering apparatus (30) that includes a venting feature as described herein. Filter apparatus 30 includes housing 41 that includes bowl 42 and manifold 48. Housing 41, at a distal (upper) end of bowl 42, is equipped with core vent 34 and housing vent 44. In the assembled condition as shown, manifold 48 engages an open (lower) end of housing bowl 42 at manifold-bowl seal 60. Manifold-bowl seal 60 can be a liquid-tight seal, e.g., a threadable connection, a snap-fit connection, a bayonet style twist-lock connection, or any other suitable liquid-tight sealing connection.

Manifold 48 includes passages that include fluid inlet 82 and fluid outlet 84 for connecting apparatus 30 to a fluid input conduit and a fluid output conduit (neither being shown). Liquid 80 enters inlet 82 and flows into housing volume 77, then passes through filter membrane 54 supported by cartridge assembly 56 and into core volume 83. As unfiltered liquid 80 passes through filter membrane 54, contaminants of the unfiltered liquid are removed and retained by filter membrane 54, and permeate 81 having a reduced level of contaminants is produced. Permeate 81 exits core volume 83 and flows out of assembly 30 by passing through outlet 84.

Housing bowl 42 includes core vent 34 at a distal end (upper end, when oriented in a bowl-up configuration a shown) of the housing bowl 42. Core vent 34 includes a tube, conduit, channel, or other flow path that connects core volume 83 with a location that is exterior to assembly 30. Additionally, and optionally, housing bowl 42 also includes housing vent 44, which also is located at a distal (upper) end of bowl 42, which provides for fluid communication between housing volume 77 and a location at the exterior of assembly 30.

Optionally, but not specifically illustrated, assembly 30 can include a ESD mitigation feature such as a conductive polymer located at one or more of structures of assembly 30, that connects the interior of assembly 30 to electrical ground. An example ESD mitigation feature may be structure of assembly 30 that includes a conductive polymer. For example, any one or more of housing bowl 42, core vent 34, housing vent 44, and cartridge assembly 56 may be made completely or partially of conductive polymer.

Figure 4:
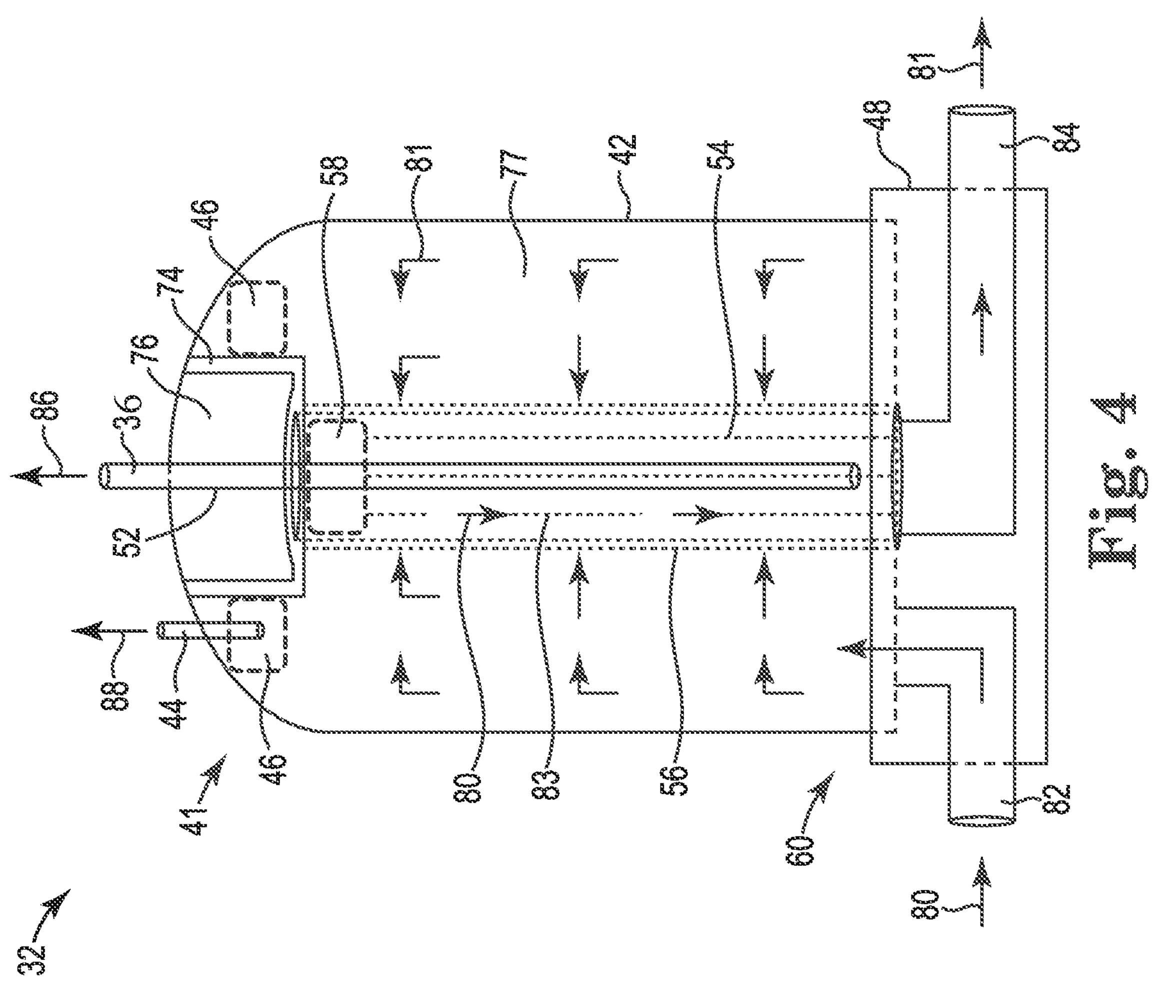
FIG. 4 is a schematic view of a filter apparatus in a bowl-up configuration with a core vent passing through a distal end of a filter housing.

A second example of a liquid filtering apparatus (32) as described, that includes a top-mounted core vent, is described at FIG. 4. Assembly 32 of FIG. 4 includes structures and functionality that are comparable to those of apparatus 30, but with longer core vent 36 of assembly 32 replacing shorter core vent 34 of assembly 30. Core vent 36 extends from an exterior location, through distal end of housing 42, into core volume 83, and to a lower portion of core volume 83. Core vent 36 includes a lower end located at the lower portion of core volume 83, with an opening at that end. While not specifically shown, one or more additional openings may be present along the length of core vent 36, including one or more openings that may be located at the upper portion of core volume 83. An optional and potentially preferred feature of core vent 36 that is not specifically illustrated, is an ESD mitigation feature as described.

Each of assemblies 30 and 32 shows a liquid filtering apparatus that includes a core vent (34 and 36, respectively) that allows for venting of a core volume 83 through a flow path and conduit that generally align with a central axis of cartridge assembly 56, which extends between an exterior location to an upper portion of core volume 83 (assembly 30) or to a lower portion of core volume 83 (assembly 32), when the assembly is in the bowl-up configuration.

As illustrated at FIGS. 3 and 4, assembly 30 or 32 receives unfiltered liquid 80 that enters the housing 41 through inlet 82. Once unfiltered liquid 80 is received, the liquid flows and is distributed within housing volume 77 between cartridge assembly 56 and an interior side of bowl 42. Filter membrane 54 of filter cartridge 56 is in the fluid flow path between the inlet 82 and outlet 84, so that fluid passing into the inlet 82 is filtered before exiting assembly 30 through outlet 84.

As illustrated by arrows, a unfiltered liquid 80 flows through filter membrane 54 supported by filter cartridge 56, whereby various contaminants, particles, or impurities present in the unfiltered liquid may be removed from the unfiltered liquid by mechanical or chemical features of the filter membrane (e.g., pores, reactive functional groups, adsorption onto a membrane surface). Filtered liquid (a.k.a. "permeate") 81 can pass from the core volume 83 through outlet 84 to exit housing 41. Various pumps, valves, flow regulators, and conduits, etc., can be effective to cause a desired volume and rate of fluid to flow through the assembly.

During use, a less dense fluid phase such as a gas can separate from the liquid phase (80, 81) passing through assembly 30 or 32, before or after the liquid passes filter membrane 54. Fluid 80 in a liquid phase upon entering housing volume 77, but may contain air bubbles or dissolved gas. The air bubbles from dissolved gas can be formed, for example due to a fluid pressure drop during filtration. The gas can form and accumulate in a valve core gas pocket 46 in an upper portion of the housing volume 77. In addition, a core side gas pocket 58 may form and accumulate within gas side space 83 at an upper portion of gas side space 83. The gas phase, being less dense than the liquid phase of liquid 80, 81, will accumulate above the liquid from which the gas phase is separated.

Housing gas pocket 46 located at the upper portion of housing volume 77 can be vented as gas 88 to an exterior of the housing 41 via housing vent 44. Gas in pocket 58, located at the upper portion of gas side space 83, can be vented as gas 86 to an exterior location through core vent 34 (at FIG. 3) or through vent 36 (at FIG. 4). By providing vents on both of the housing space side 77 and the core volume side 83 of filter membrane 54, substantially all accumulated gas within apparatus 30 can be beneficially vented to an exterior location.

Still with reference to FIGS. 3 and 4, at a distal (upper) end of bowl 42 of assembly 30, a sealed upper space 76 is defined in part by an interior surface of bowl 42, e.g., by partition 74 as illustrated. Partition 74 separates housing volume 77 from sealed upper space 76, which includes vent 34 or vent 36. Sealed upper space 76 can also be defined in part by a surface of a distal end of cartridge assembly 56, which contacts a surface of partition 74 when the cartridge assembly is installed at the interior of housing bowl 42.

Upper space 76 can be shaped and positioned at a location above cartridge assembly 56, and can provide a liquid-tight space between the distal end of filter cartridge 56 and an inner surface of the housing bowl, at a distal end of the housing bowl. As shown at FIGS. 3 and 4, vents 34 and 36 are each sealed from upper space 76 while passing through upper space 76. In other example embodiments, a vent 34 or 36 can be in fluid communication with upper space 76.

The cartridge assembly distal end may interface with partition 74 by any useful manner that forms a liquid-tight cartridge assembly-bowl seal. The engagement may be, e.g., by threadable interface, a press-fit engagement, a snap-fit engagement, or the like.

Figure 5:
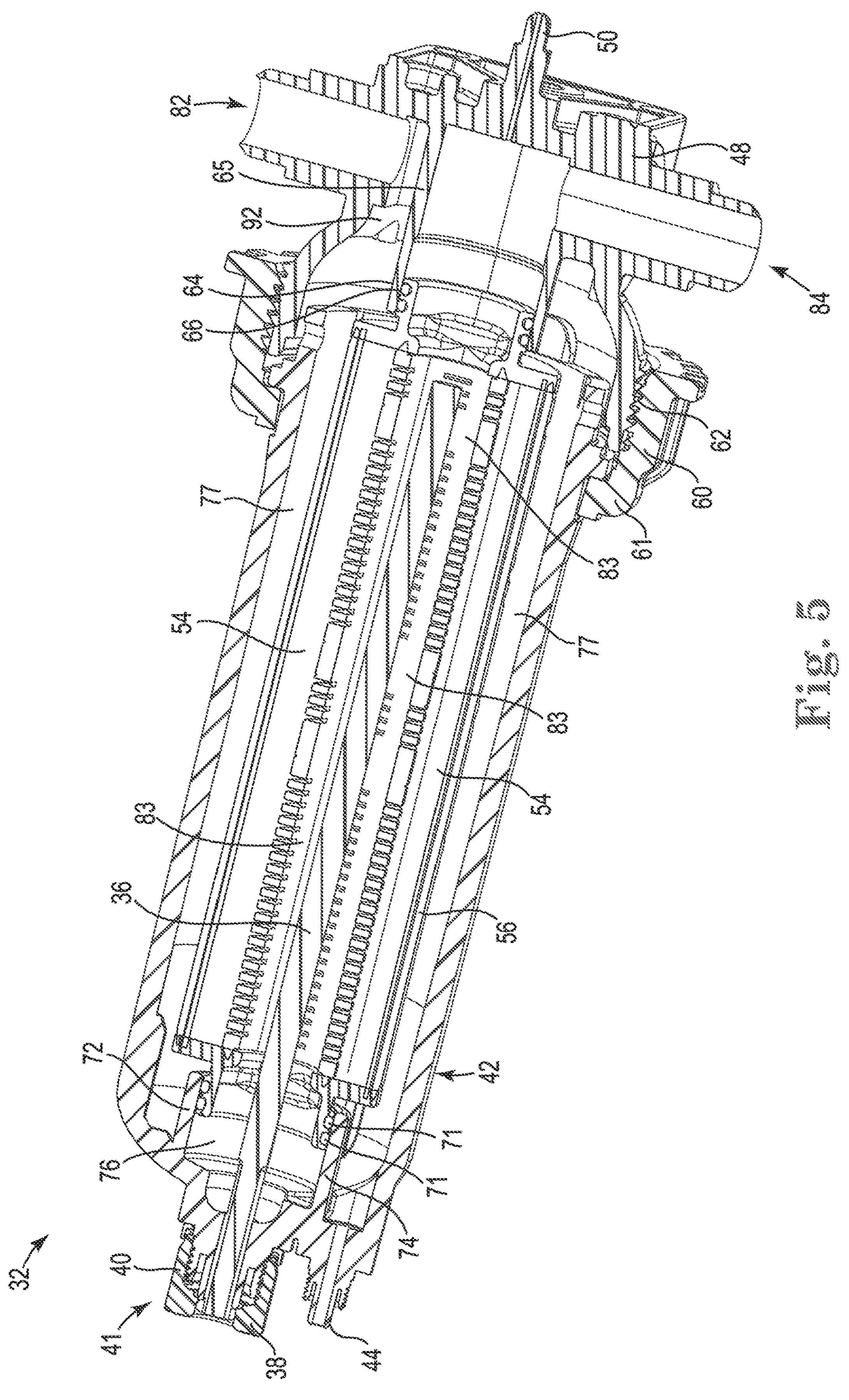
FIG. 5 is a cross-sectional view of an example filter apparatus of FIG. 4.
Figure 6:
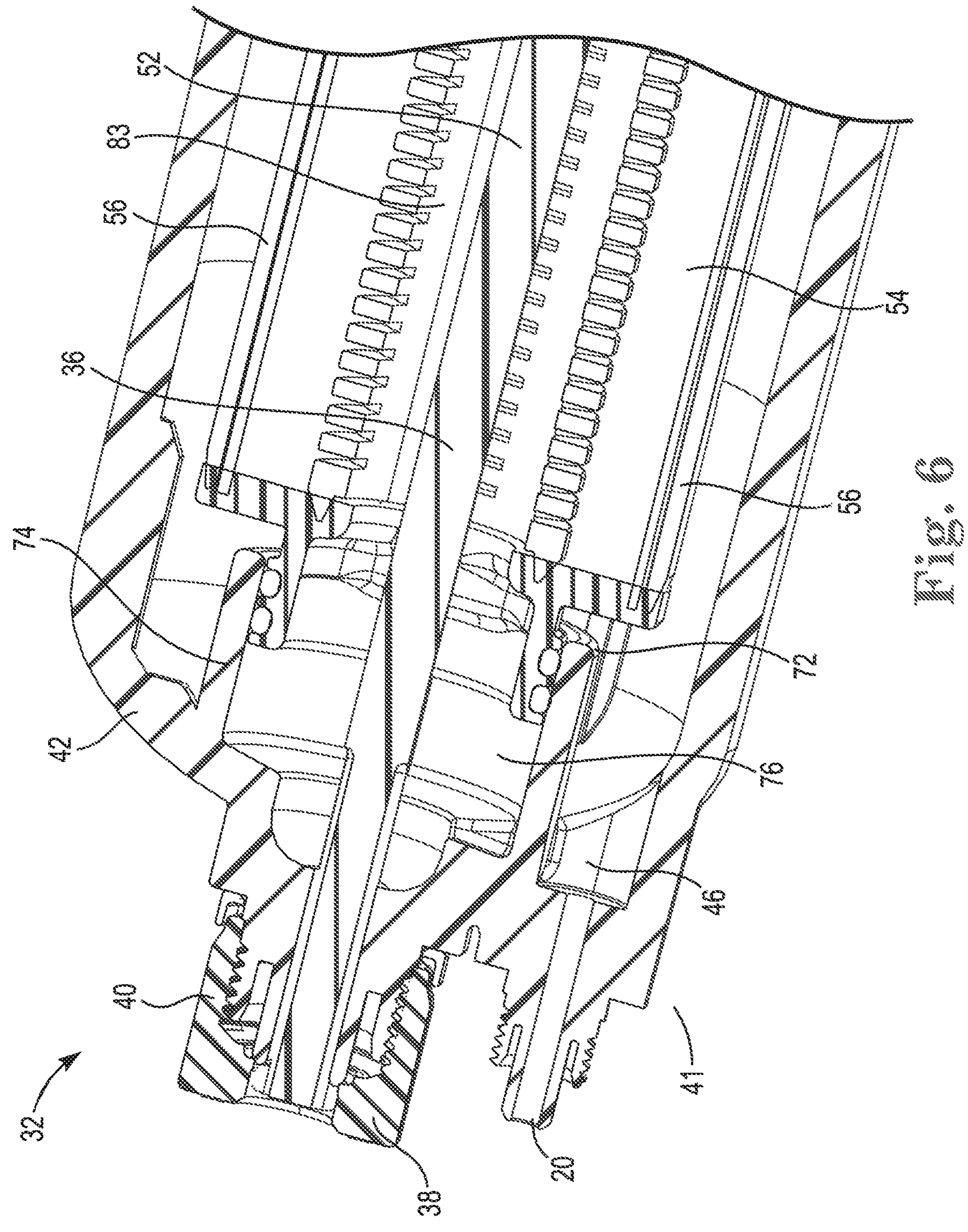
FIG. 6 is a close-up view of a portion of the filter apparatus of FIG. 5.
Figure 7:
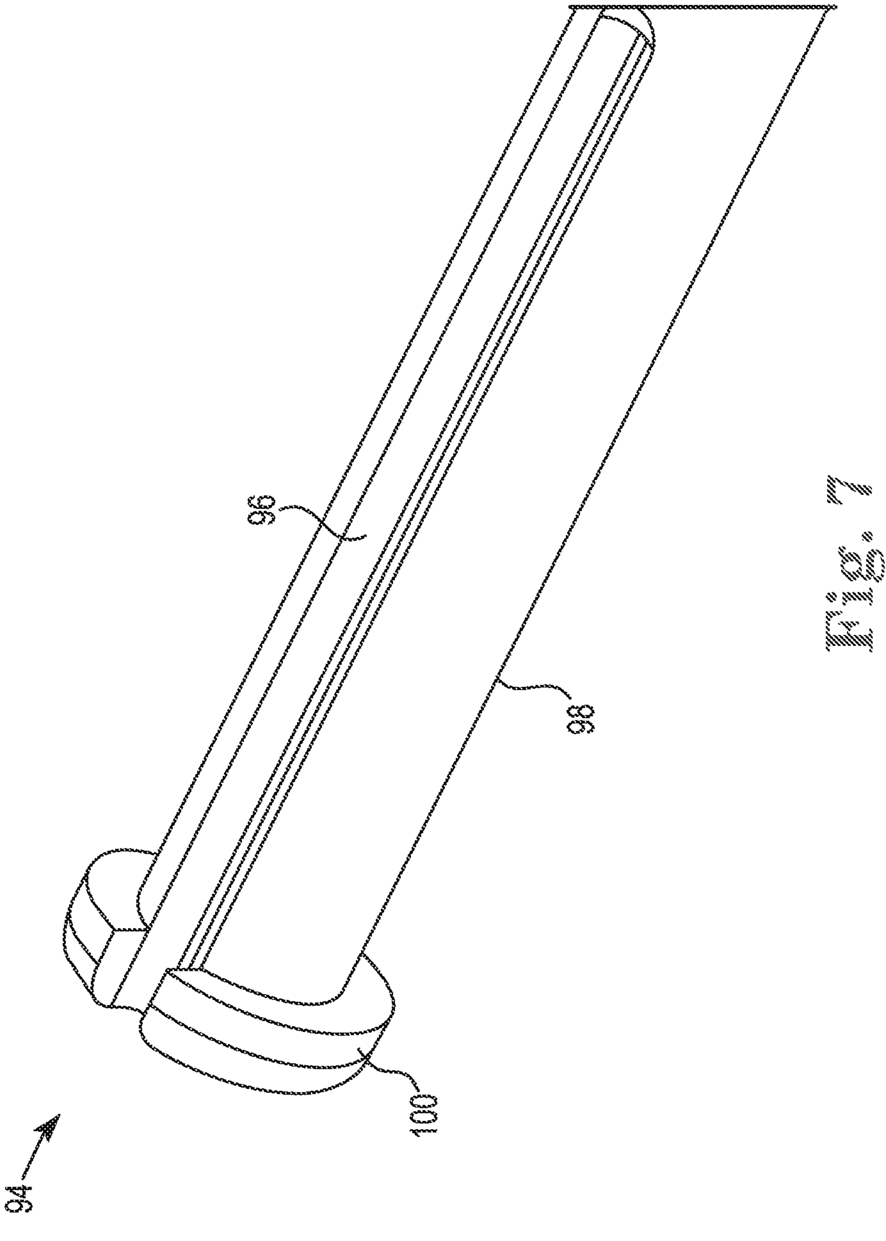
FIG. 7 is a detailed view of a core vent adapted to include optional an electrostatic discharge mechanism.

FIGS. 5, 6, and 7 are illustrations of example assembly 32 of FIG. 4, using like number designations for like features and structures, and with additional detail, particularly with respect to the cartridge assembly-bowl seal, the cartridge assembly manifold seal, and an ESD mitigation feature.

FIGS. 5 through 7 show assembly 32 that that includes a core vent 36 that extends to a lower (proximal) portion of core volume 83, meaning a portion that is at half, third, or quarter of core volume 83 closest to manifold 48. Vent 36 can be any structure that provides for fluid to pass along the vent, from core volume 83 to an exterior location. Vent 36 may be a hollow tube, or may alternately be a slotted tube (see FIG. 7) that functions as a tube for venting, as well as an ESD mitigation feature. Vent 36 can be configured to provide venting of core volume 83 to an exterior location as described herein. As one optional vent 36, a vented (slotted) probe 96 as shown at FIG. 7 may be used (see discussion of FIG. 7, below). Alternatively, vent 36 can be a hollow tube or pipe that includes one or more apertures or holes along the length of vent 36, such that various depths of the core volume 83 are vented, including at an upper portion. Either type of vent structure may be made in part or completely of conductive polymer, e.g., conductive fluoropolymer, to make up art of an ESD mitigation feature.

FIGS. 5 and 6 show filter apparatus 32 of FIG. 4 in greater detail. In particular, these Figures show examples of press-fit type seals used for each of a cartridge assembly-bowl seal 72 and a cartridge assembly-manifold seal 64.

Cartridge assembly-bowl seal 72 is shown as a seal between a cylindrical surface of a distal end of cartridge assembly 56, and an opposing interior cylindrical surface of housing bowl 42 that is located on an inner cylindrical surface of partition 74. Between these two opposed surfaces, when engaged, are two "O-ring" type gaskets, 71 and 71, which provide a fluid-tight seal between the surfaces. This cartridge assembly-bowl seal also provides a fluid tight seal of the sealed upper space 76 from the housing volume 77.

The cartridge assembly-manifold seal (64) is shown as a seal between a cylindrical surface of a proximal end of cartridge assembly 56, with an opposing interior cylindrical surface of manifold 48, which is part of partition 65. Between these two opposed surfaces, when engaged, are two "O-ring" type gaskets, 66 and 66.

As shown, assembly 32 also includes a core vent upper fitting 38 that includes threads 40 for attachment to a distal end or portion of bowl 42. Fitting 38 can be threadably tightened to secure core vent 36 of assembly 32 to the distal end of bowl 42, and can provide a sealed fitment at the distal end of the bowl 42. The fitting 38 connection to bowl 42 and vent 36 can be part of an ESD mitigation feature, such as by functioning as a portion of a circuit between an ESD feature located on vent 36, and electrical ground (not shown).

Also shown are examples of details related to manifold-bowl seal 60. For example, as shown in FIGS. 5 and 6, manifold 48 is provided with external threads 62 for manifold-bowl seal 60, and a fitting 61 is shown that threads to manifold threads 62 to securely attach bowl 42 to manifold 48. When cartridge assembly 56 and bowl 42 are tightened against manifold 48 by operation of threaded fitting 61, housing volume 77 is in fluid communication with inlet 84 and core volume 83 is in communication with outlet 84.

Cartridge assembly 56 and its filter membrane 54 can include structures as generally known in the filtration arts, and as described herein, particularly including a filter membrane useful for filtering fluids and liquids used in semiconductor and microelectronic device processing.

A lower core vent 50 between outlet 84 of manifold 48 and an exterior location can optionally be provided on the manifold 48. As assembly 32 is preferably mounted in a bowl-up configuration, vent 50 can be provided as a drain or high-pressure fluid release valve, and is optional.

FIG. 7 shows an example vent (e.g., vent 36) in an embodiment as a slotted core vent or probe 94 comprising a venting slot 96, and having a probe body 98. As shown, probe 94 is not hollow, although other embodiments can implement a hollow, tube-like probe or other vent 36. A ring 100 is also provided on the probe 94. Probe 94 can be conductive, to provide ESD mitigation as described herein. Probe 94 may optionally stay assembled to bowl 42 and may not be removed or replaced with cartridge assembly 56. Probe 94 is an example of vent 36, but represents only a non-limiting example of the vent 36. Vent 36 can be substantially tubular, hollow, perforated, or otherwise shaped to allow for venting of a core volume when installed as part of an liquid filtering apparatus.

Some embodiments described with reference to FIGS. 3 through 7 may require a purpose-built or modified mold for housing bowl 42, relative to many current filtration products. Furthermore, the design of cartridge assembly 56 also requires modification relative current filtration products, to interface and function with the modified housing bowl, to accommodate the core venting feature. Therefore, and as described below, various alternative embodiments are described with reference to FIGS. 8 through 12, than may be useful with existing (e.g., currently commercially available) housing bowl products, or other existing portions of currently commercially available filter apparatus designs, while adding a core venting feature as described.

Turning now to FIG. 8 through 12, an alternative set of embodiments of a filter apparatus 102 according to the present disclosure is shown and described. As a difference between assemblies 30 and 32, core vent 110 extends from core volume 83 downward to manifold 106, instead of extending upward to the distal end of housing bowl 127. As a result, apparatus 102 can include a more conventional housing bowl 127 (based on many current commercial designs) that is not provided with a core vent aperture and that also does not require an interior surface that is configured to contact and produce a seal with a distal end of cartridge assembly 56.

With assembly 102, core vent 110 is at a location that passes through manifold 106, and may be provided with an ESD mitigation feature, as described herein. For example, a conductive striped perfluoralkoxy (PFA) vent tube 110 assembly may be included as a component of cartridge assembly 56. Assembly 102 therefore allows venting of a core volume 83, especially at a upper portion of core volume 83, for example to remove gas of gas pocket 58 shown at FIG. 8. In example embodiments, core vent 110 can be engaged with and secured as part of cartridge assembly 56. In such embodiments, core vent 110 is considered to be a component of cartridge assembly 56.

Desirably, cartridge assembly 56, which includes core vent 110 as a component thereof, may engage manifold 106 in a press-in engagement to form a cartridge assembly-manifold seal as described herein. In this engagement, an upper elongate portion of vent 110 extends vertically within core volume 83. A lower portion of vent 110 is connected to a proximal end of cartridge assembly 56, and the cartridge assembly proximal end engages an opening of manifold 106 to form a press-fit cartridge assembly-manifold seal. Bowl 127 can be a conventional (based on current commercial products) filter bowl according to various industry uses, and can include housing vent 44 as described above, but does is not require to and my preferably avoid contact with a distal end of cartridge assembly 56.

Figure 9:
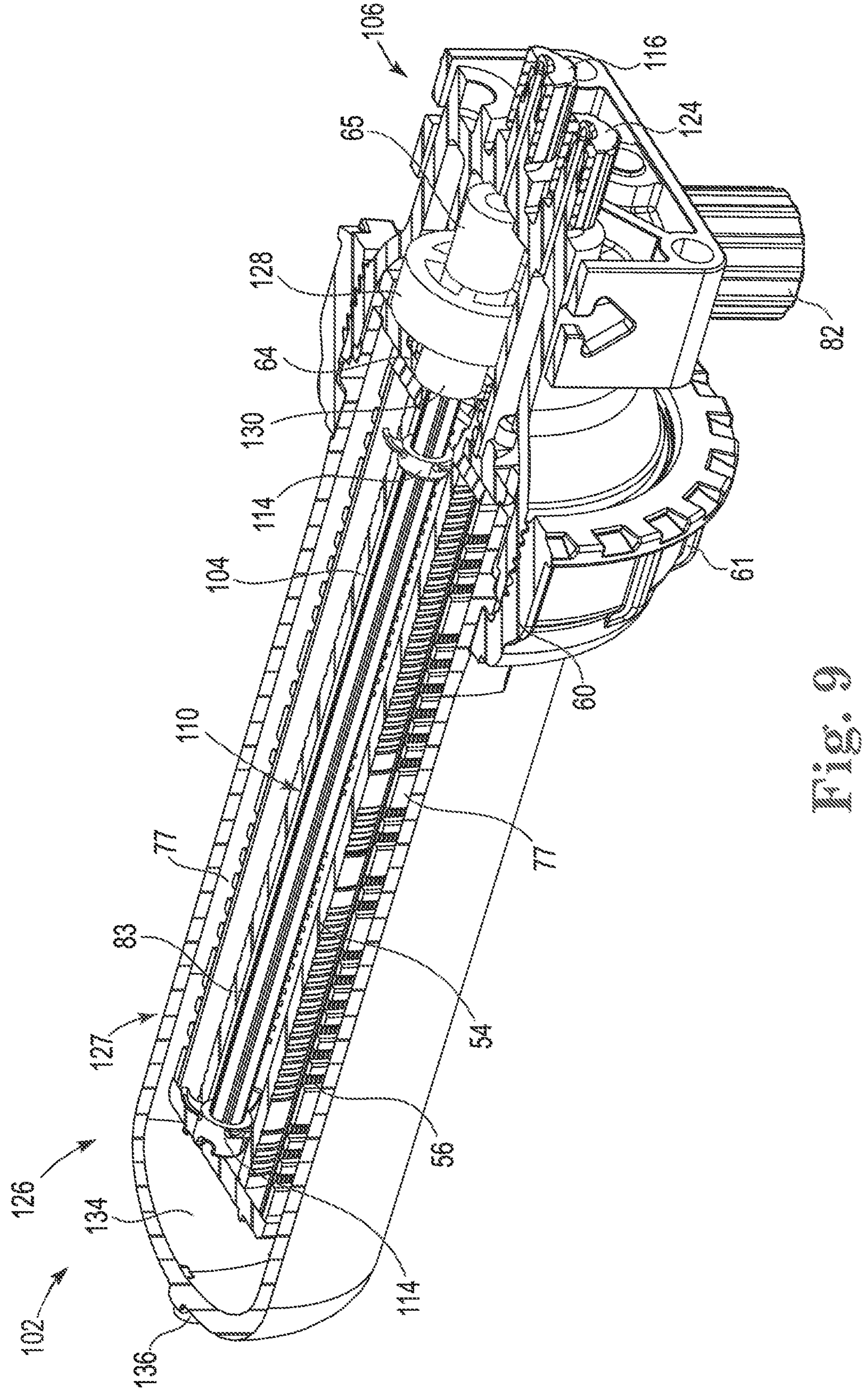
FIG. 9 is a cross-sectional perspective view of an example filter apparatus of FIG. 8.
Figure 10:
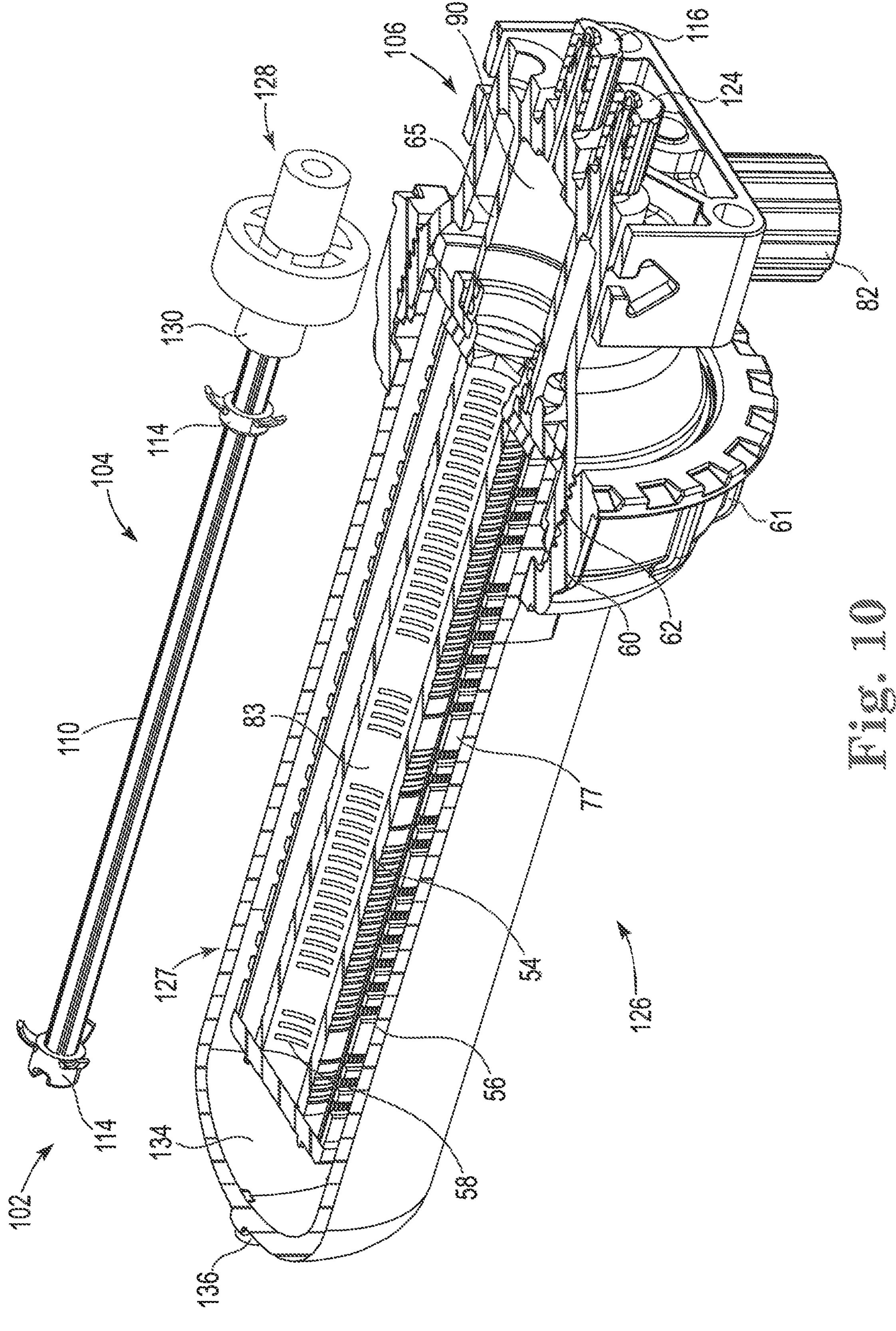
FIG. 10 is a cross-sectional semi-exploded view of the filter apparatus of FIG. 9 showing a vent assembly removed from the remaining filter apparatus components.
Figure 11:
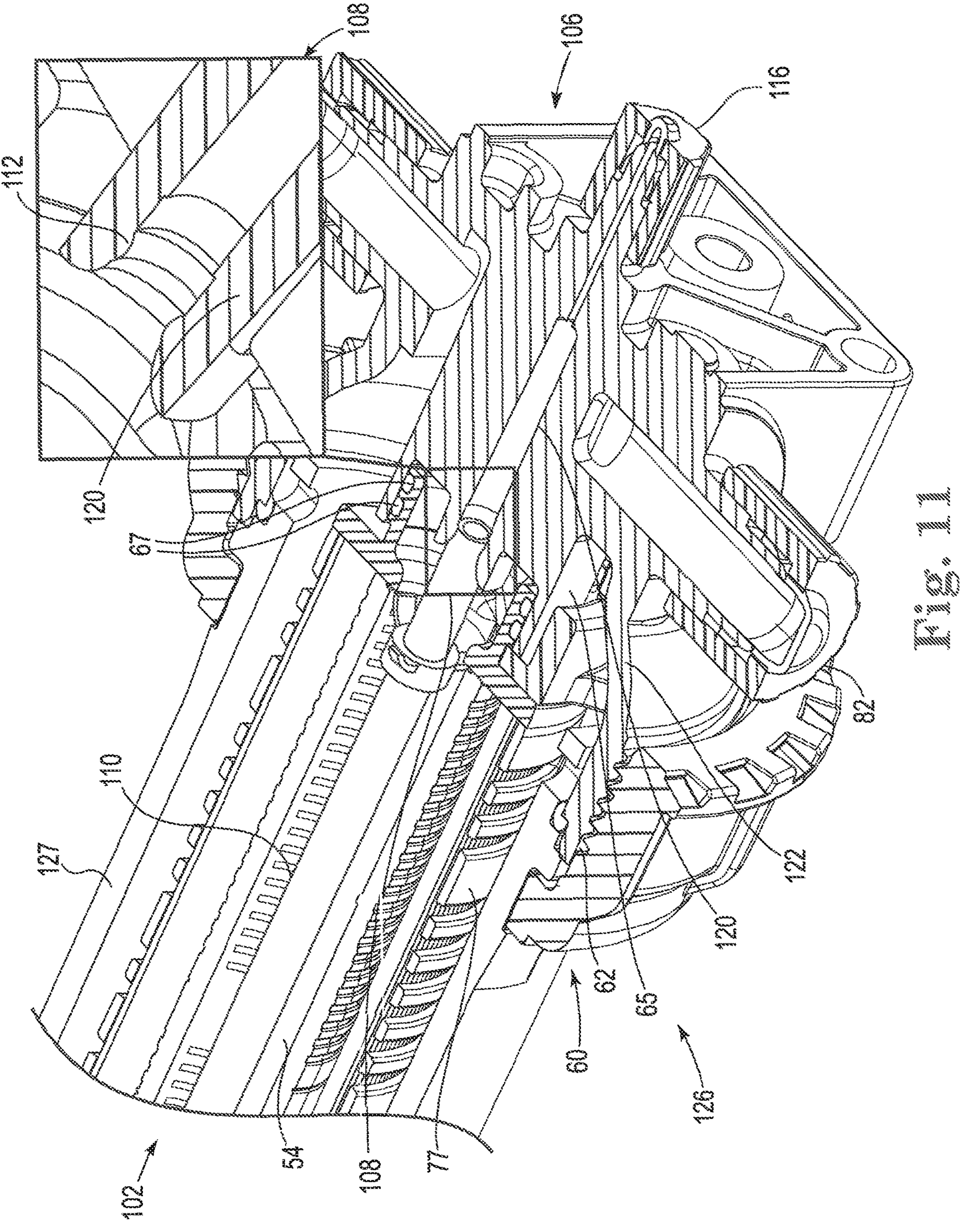
FIG. 11 is a cross-sectional perspective and close-up view of a portion of the filter apparatus of FIG. 8.

With reference now to FIGS. 9, 10, and 11, assembly 102 is shown in in a cut-away side-perspective view, but may be installed and used in a bowl-up configuration. FIG. 9 shows a horizontal, perspective cross-section view of assembly 102 in an assembled state. FIG. 10 shows an exploded view of the horizontal, perspective cross-section view of assembly 102 of FIG. 9, with vent 104 separated from cartridge assembly 56. FIG. 11 is a horizontal, perspective cross section view of assembly 102 of FIG. 9, but additionally with a cut-away cross sectional view of adapter 128 installed within manifold 106.

Figure 8:
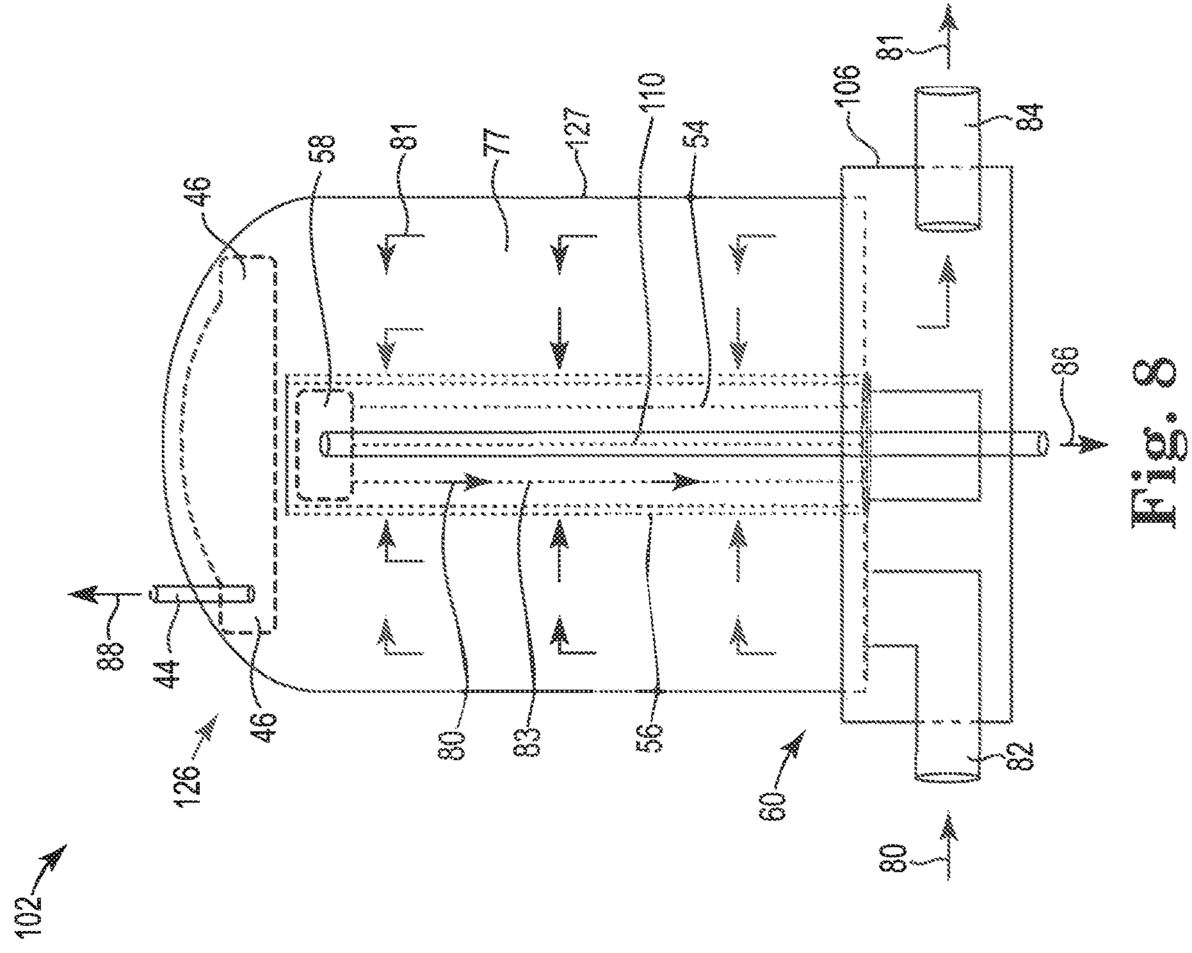
FIG. 8 is a schematic view of filter apparatus in a bowl-up configuration with a core vent passing through a housing manifold.

As illustrated, assembly 102 of FIGS. 9, 10, 11, and 12 includes features that are comparable to those assembly 102 of FIG. 8, including bowl housing 127, manifold 106, and cartridge assembly 56. Added exemplary details of these features are shown at FIGS. 9, 10, 11, and 12.

As shown at FIGS. 9 and 10 (showing vent assembly 104 separated from other components for purposes of illustration), vent assembly 104 includes elongate core vent 110 that is adapted to fit within core volume 83. At a proximal end of core vent 110 is adapter 128 configured to fit within a space (90) of manifold 106 during use. Vent assembly 104 can be securely fixed in position relative to cartridge assembly 56, and can be considered to be a component of cartridge assembly 56.

Adapter 128 is engaged with a proximal end of core vent 110 at tube-head adapter 108 (see FIG. 11). As shown with reference to FIG. 11, an electrically conductive connection can be provided between manifold 106, adapter 128 and vent tube 110, via extended surface 112 extending inward from a (cylindrical or annular) collar of coupler 130. Extended surface 112 can be included as a structure that produces an interference fit, snap fit, or other positive connection between coupler 130 of adapter 128 and the proximal end of vent tube 110. The positive connection allows for reliable contact for electrical and ESD conductivity.

Vent tube 110 provides a passage between an upper (distal) portion of core volume 83, and manifold 106, that allows core volume 83 to be vented to an exterior location by core vent orifice 116 on manifold 106. As shown in FIGS. 9 and 10, manifold 106 also optionally includes housing vent 124 in communication with housing volume 77, which can allow for removal of fluid from housing volume 77 from the bottom of assembly 102, e.g., to drain liquid fluid from housing volume 77.

As illustrated, adapter 128, which includes coupler 130 (e.g., Entegris CHEMLOCK system), is sized and shaped to fit within a central opening of manifold 106 that is located directly below cartridge assembly 56. In various embodiments, during removal and replacement of a cartridge assembly 56 of apparatus 102, vent assembly 104 remains part of cartridge assembly 56 being replaced. In this respect, each of elongate core vent 110 and adapter 128 of vent assembly 104 is an attached component of cartridge assembly 56 such that when assembly 56 is removed from engagement with manifold 106, elongate core vent 110 and adapter 128 remain with the assembly. Fasteners 114, located along a length of core vent 110, allow core vent 110 to be inserted into core volume 83, to connect vent assembly 104 to cartridge assembly 56 for this purpose. Fasteners 114 have an opening for core vent 110 to pass through and prongs that function to exert pressure on the inside of the filter core to position and align core vent 110. In some embodiments, an end cap may be place on the ends of the filter cartridge that provides an opening through which core vent 110 passes to provide positioning and alignment.

Additionally, assembly 102 as illustrated includes vent 136 at a distal end of housing bowl 127. When assembly 102 is installed in a bowl-up configuration, during operation, bowl 127 may accumulate gaseous fluid at upper portion 134 of housing volume 77. Assembly 102 includes vent 136, optionally including a valve that may be selectively opened and closed to allow release of gas that may accumulate at upper space 134 from the interior of the housing.

Figure 12:
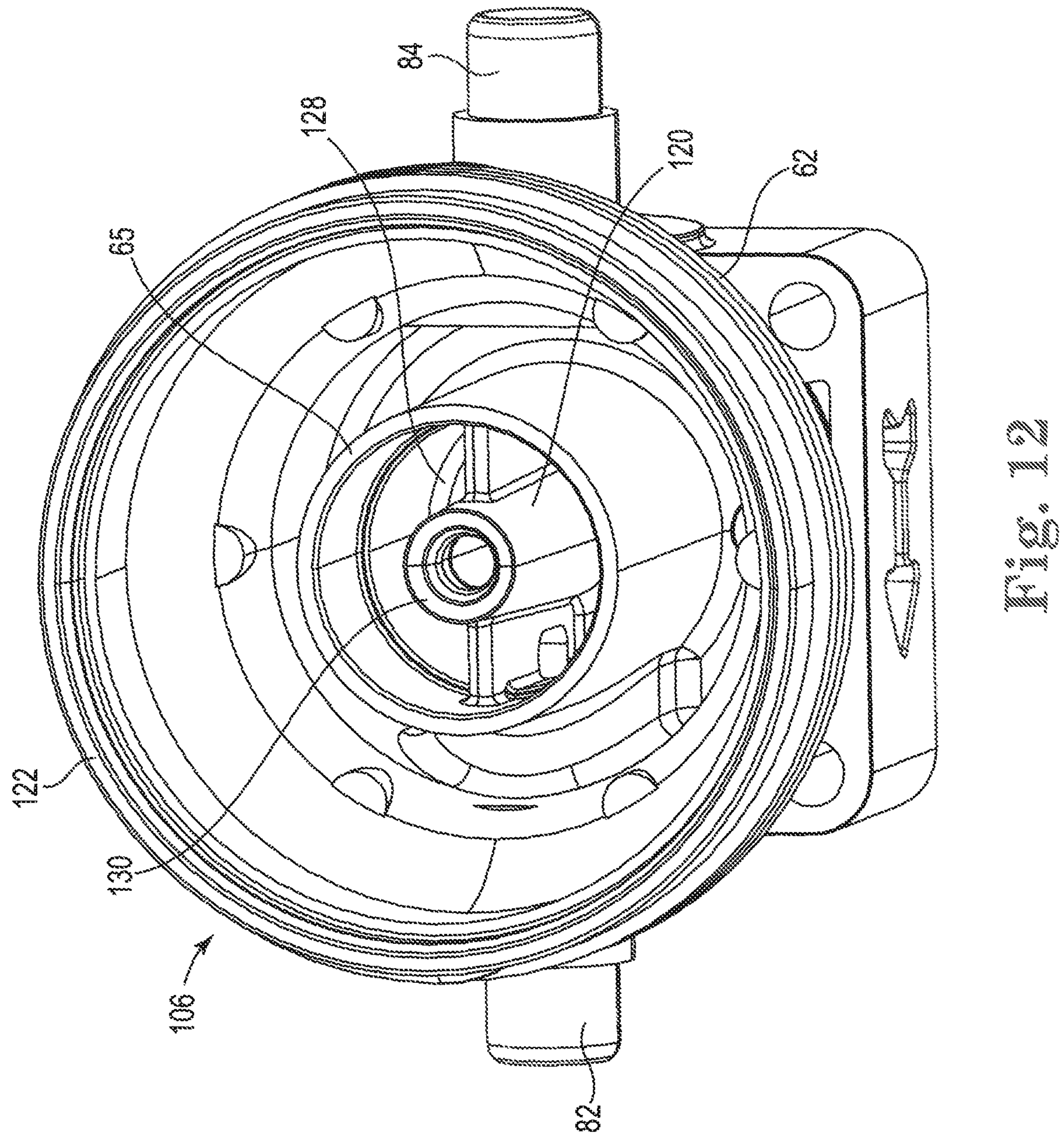
FIG. 12 is an upper perspective view of a manifold of the filter apparatus of FIG. 11.

With reference to FIGS. 11 and 12, these Figures show a variation of assembly 102 of FIGS. 9 and 10 in which adapter 128 is included as an integral, molded portion of manifold 106. Manifold 106 and adapter 128 together form a single molded piece that includes a plurality of concentric circles or partitions. Innermost partition 120 includes an opening that engages a proximal end of vent tube 110. Intermediate partition 65 is a surface of manifold 106 that contacts an opposing surface of a proximal end of cartridge assembly 56 to provide a fluid-tight seal between manifold 106 and cartridge assembly 56 as described above, i.e., is a surface that is part of a cartridge assembly-manifold seal between cartridge assembly 56 and manifold 106. Also shown are "O-rings" 67 between the two opposed surfaces. Manifold 106 also includes outer wall 122 that includes optional threads 62 as described above, which can be part of a bowl-manifold seal. The coupling feature (coupler) 130 is also shown from a perspective view, where a surface of vent tube 110 is adapted to engage adapter 128.

A liquid filtering apparatus as described can be used for methods of removing undesired particles, particulates, contaminants, or impurities from a source of unfiltered liquid. The particles or impurities may include inorganic and organic materials such as dissolved organic compounds, dissolved metals, solid metals, and other solid organic or inorganic materials. The described methods are performed by causing unfiltered liquid to flow into the apparatus, e.g., through an inlet as described, and through a filter membrane supported within the apparatus by a cartridge assembly. After passing through the filter membrane, the filtered liquid ("filtrate") can pass out of the apparatus, e.g., through an outlet as described. During use of a liquid filtering apparatus as described, if gaseous fluid accumulates at an upper portion of the core volume, a venting feature as described can be used to that volume of gaseous fluid from the core volume.

A liquid filtering apparatus as described may be useful for processing various types of fluids, for uses in different industries. As one example, the presently described apparatuses and methods may be effective for preparing purified liquids for use in semiconductor and microelectronic processing, for example in methods used to manufacture solar panels, flat panel displays, and semiconductor and microelectronic devices. The liquids may be used in a process such as photolithography, bulk chemical delivery, chemical mechanical processing (CMP), wet etching, or cleaning, among other types of processes.

During use, a filter membrane of a cartridge assembly removes impurities from a flow of liquid through the membrane. The filter membrane will have a limited operational lifetime, and after an amount of unfiltered liquid has been passed through the filter membrane, the membrane must be replaced. A method of changing the cartridge assembly and an attendant filter membrane in a liquid filtering apparatus that is installed in a bowl-up configuration can include a step of draining liquid from the housing, including from both the housing volume and the core volume. With the liquid drained from both interior spaces, the manifold-bowl seal can be disassembled. The bowl may then be vertically lifted away from the manifold to separate the bowl from the manifold.

In example methods of replacing a cartridge assembly, and depending on the type of engagement used to produce the cartridge assembly-manifold seal, the cartridge assembly may be required to remain in place while the bowl is removed, with the cartridge assembly proximal end remaining engaged with the manifold. According to these designs, a cartridge assembly-bowl seal at the distal end of the cartridge assembly, if present, must be disassembled before removing the cartridge assembly from the manifold. With the cartridge assembly proximal end still engaged with the manifold, the bowl is lifted to a height that places the open end (lower end) of the bowl above the height of the distal end (upper end) of the cartridge assembly (which is engaged with the manifold) to uncover the cartridge assembly. The cartridge assembly may subsequently be removed from the manifold by disassembling the cartridge assembly-manifold seal at the proximal end of the cartridge assembly. Then, a replacement cartridge assembly may be engaged with the manifold by engaging the cartridge assembly proximal end with the manifold. The bowl may then be re-installed over the manifold and cartridge assembly.

With this example method of replacing a filter cartridge of a liquid filtering apparatus, a core vent feature at a housing bowl distal end as described, such as a vent 34 or 36 of FIG. 3, 4, 5, or 6, may remain engaged with the bowl during replacement of the cartridge assembly. A core vent as described may be engaged and remain with a location of the bowl distal end during a replacement step, and is not required to be removed and replaced with the cartridge assembly. Alternately, in other example apparatuses, a vent may be considered to be part of the cartridge assembly and may be removed from the housing as part of the cartridge assembly and replaced as part of the cartridge assembly.

With some installed liquid filtering apparatuses, a preferred method of replacing a cartridge assembly of a liquid filtering apparatus installed in a bowl-up configuration may desirably overcome the need for lifting the housing bowl to a height of the bowl open end that is above the height of the cartridge assembly, while the cartridge assembly proximal end remains engaged with the manifold. For example, in certain types of semiconductor and microelectronic device processing systems (e.g., "tools") and their locations of use (a clean room), the value of space within the tool or room is substantial, including space above a filtering apparatus.

Advantageously, according to the present description, certain examples of liquid filtering apparatuses are capable of being disassembled for the purpose of replacing a cartridge assembly without the need to lift the bowl to a height (of the bowl open end) that is above the height of the cartridge assembly, to uncover and expose a cartridge assembly that remains engaged with the manifold. In specific, various apparatuses as described include a combination of a manifold and a cartridge assembly proximal end that can be assembled to form a cartridge assembly-manifold seal by pressing the cartridge assembly proximal end into contact with a surface of the manifold. See, e.g., FIGS. 5, 9, 10, and 11. The pressing motion of the cartridge assembly toward the manifold to form the seal may be exclusively along the central axis of the cartridge assembly toward the manifold, and forming the seal does not require any other direction of movement of the cartridge assembly such as any rotation of the cartridge assembly about the central axis of the cartridge assembly. The engagement that produces the seal does not include a threaded engagement, a twist-locking engagement, or any other engagement that requires movement of the cartridge assembly in any direction other than along the central axis.

This type of a preferred press-fit seal, as described (and as illustrated in detail at FIGS. 5, 9, 10, and 11), can be disassembled by an opposite movement that includes movement of the cartridge exclusively along the central axis of the cartridge assembly away from the manifold, i.e., upward. The require distance of the movement is limited, and only requires that the proximal end of the cartridge assembly be lifted a distance above the manifold to provide physical, vertical clearance (space) between the proximal end of the cartridge assembly and the manifold. Upon disassembling both the bowl-manifold seal and the cartridge assembly-manifold seal, and lifting the bowl and the cartridge assembly to a height that provides vertical clearance between both the bowl and the manifold and the proximal end of the cartridge assembly and the manifold, the bowl and the cartridge assembly may be moved together, laterally away from the space above manifold, with the cartridge assembly remaining located at least partially within (or substantially within) the interior space of the bowl. The lateral movement produces lateral clearance between the manifold and the bowl, and the manifold and the cartridge assembly.

Upon removing the cartridge assembly and the bowl away from the manifold, the cartridge assembly distal end may remain connected to the interior of the distal end of the bowl, at the cartridge assembly-bowl seal. This seal can be disassembled to allow the cartridge assembly to be removed from the interior space of the bowl. The motion required to disassemble the cartridge assembly-bowl seal will depend on the type of seal, e.g., threaded, twist-locking, or press-fit. For a press-fit seal, e.g., as illustrated at FIGS. 5 and 6, the seal may be disassembled exclusively by a pulling motion along the central axis of the cartridge assembly, to move the cartridge assembly away from the bowl distal end.

With this example method of replacing a filter cartridge of a liquid filtering apparatus, a vent feature as described, such as a vent 34 or 36 of FIG. 3, 4, 5, or 6, may remain engaged with the bowl during replacement of the cartridge assembly. A vent as described may be engaged and secured at a location of the bowl distal end, and is not required to be removed and replaced with the cartridge assembly. In other embodiments, a vent may be considered to be part of the cartridge assembly, and may be removed from the housing and replaced as part of the cartridge assembly.

In a first aspect, a liquid filtering apparatus comprises: a bowl comprising an open end, a distal end opposite of the open end, and an interior that extends between the open end and the distal end; a manifold that is capable of sealingly engaging the open end of the bowl, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the bowl; and a vent extending through the manifold to a distal portion of the core volume to fluidly connect the distal portion of the core volume with an exterior of the liquid filtering apparatus.

In a second aspect according to the first aspect, the cartridge assembly has a central axis extending between the cartridge assembly proximal end and the cartridge assembly distal end, within the core volume; the cartridge assembly-manifold seal can be formed by pressing the cartridge assembly proximal end surface into contact with the surface of the manifold, with movement of the cartridge assembly along the central axis toward the manifold; and the cartridge assembly-manifold seal can be disassembled by pulling the cartridge assembly proximal end surface from the surface of the manifold, with movement of the cartridge assembly along the central axis away from the surface of the manifold.

In a third aspect according to the first or second aspect, the cartridge assembly includes a vent assembly that includes a core vent that extends from the proximal end of the cartridge assembly to the distal portion of the core volume.

In a fourth aspect according to any preceding aspect, the fluid inlet communicates with the housing volume, and the fluid outlet communicates with the core volume.

In a fifth aspect according to any preceding aspect, the vent comprises a conduit that has a first end and a second end, the first end is located at a distal portion of the core volume and the second end is located at the exterior.

In sixth aspect according to any preceding aspect, the vent comprises a conductive material that electrically connects the core volume to electrical ground.

In a seventh aspect, an apparatus according to any of the preceding aspects is installed in combination with a semiconductor manufacturing tool, to supply filtered liquid flowing from the fluid outlet to the semiconductor manufacturing tool.

In an eighth aspect, a method of filtering a liquid using a liquid filtering apparatus comprising a housing that includes a manifold and a bowl, with the bowl situated vertically above the manifold, the housing comprises: the bowl, which comprises an open end, a distal end opposite of the open end, and an interior that extends between the open end and the distal end; the manifold, which is engaged with the open end of the bowl to form a manifold-bowl seal, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the bowl; and a vent extending through the manifold to a distal portion of the core volume to fluidly connect the distal portion of the core volume with an exterior of the housing, the method comprising: passing liquid through the apparatus by passing the liquid in the inlet, from the inlet through the housing volume, through the filter membrane, to the core volume, and then through the outlet, wherein gas accumulates at the distal portion of the core volume, and releasing the gas through the vent.

In a ninth aspect according the eighth aspect, the cartridge assembly has a central axis extending between the cartridge assembly proximal end and the cartridge assembly distal end, within the core volume; the cartridge assembly-manifold seal can be formed by pressing the cartridge assembly proximal end surface into contact with the surface of the manifold, with movement of the cartridge assembly along the central axis toward the manifold; and the cartridge assembly-manifold seal can be disassembled by pulling the cartridge assembly proximal end surface from the surface of the manifold, with movement of the cartridge assembly along the central axis away from the surface of the manifold.

In a tenth aspect according to the eighth or ninth aspect, the cartridge assembly includes a vent assembly that includes a core vent that extends from the proximal end of the cartridge assembly to the distal portion of the core volume.

In an eleventh aspect according to the eighth through tenth aspects, the vent comprises a conduit that has a first end and a second end, the first end is located at the distal portion of the core volume and the second end is located at the exterior.

In a twelfth aspect according to the eighth through eleventh aspects, the vent comprises conductive material that electrically connects the core volume to electrical ground.

In a thirteenth aspect, a method of replacing a cartridge assembly of a liquid filtering apparatus comprising a housing that includes a manifold and a bowl, with the bowl situated vertically above the manifold, the housing comprising: the bowl, which comprises an open end, a distal end opposite of the open end, and an interior that extends between the open end and the distal end; the manifold, which is engaged with the open end of the bowl to form a manifold-bowl seal, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; a core volume at a central inner side of the cartridge assembly; a housing volume at an outer side of the cartridge assembly between the cartridge assembly and the housing; and a vent extending through the manifold to a distal portion of the core volume to fluidly connect the distal portion of the core volume with an exterior of the housing, the method comprising: draining liquid fluid from the liquid filtering apparatus; disassembling the manifold-bowl seal; vertically lifting the bowl and the cartridge assembly above the manifold to produce vertical clearance between the bowl and the manifold, and between the cartridge assembly and the manifold; and moving the bowl and the cartridge assembly together laterally to produce lateral clearance between the manifold and the bowl, and between the manifold and the cartridge assembly.

In a fourteenth aspect according to the thirteenth aspect, the cartridge assembly has a central axis extending between the cartridge assembly proximal end and the cartridge assembly distal end, within the core volume; the cartridge assembly-manifold seal can be formed by pressing the cartridge assembly proximal end surface into contact with the surface of the manifold, with movement of the cartridge assembly along the central axis toward the manifold; and the cartridge assembly-manifold seal can be disassembled by pulling the cartridge assembly proximal end surface from the surface of the manifold, with movement of the cartridge assembly along the central axis away from the surface of the manifold; the method comprising: disassembling the cartridge assembly-manifold seal by lifting the cartridge manifold vertically above the manifold.

In a fifteenth aspect according to the thirteenth or fourteenth aspect, the cartridge assembly includes a vent assembly that includes a core vent that extends from the proximal end of the cartridge assembly to the distal portion of the core volume.

In a sixteenth aspect according to any of the thirteenth through fifteenth aspects, the vent comprises a conduit that has a first end and a second end, the first end is located at the distal portion of the core volume and the second end is located at the exterior.

In a seventeenth aspect according to any of the thirteenth through sixteenth aspects, the vent comprises conductive material that electrically connects the core volume to electrical ground.

In an eighteenth aspect, a liquid filtering apparatus comprises: a bowl comprising an open end, a distal end opposite of the open end, and an interior that extends between the open end and the distal end; a manifold that is capable of sealingly engaging the open end of the bowl, the manifold comprising a fluid inlet and a fluid outlet; a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal; and an electrostatic discharge mitigation feature that comprises conductive polymer, that is capable of conducting electrical charge through a grounded circuit to inhibit accumulation of electrostatic charge within the apparatus.

A nineteenth aspect according to the eighteenth aspect, further comprising: a core volume at a central inner side of the cartridge assembly; a housing volume at an outer side of the cartridge assembly between the cartridge assembly and the housing bowl; and a vent extending between the core volume and a location exterior to the housing to fluidly connect the core volume with the exterior, wherein the vent comprises conductive polymer that is part of the circuit.

In a twentieth aspect according to the eighteenth or nineteenth aspect, the vent extends between a distal portion of the core volume and the location exterior to the housing.

In a twenty-first aspect according to any of the eighteenth through twentieth aspects, the vent extends between a distal portion of the core volume and the location exterior to the housing, passing through the distal end of the bowl.

In a twenty-second aspect according to any of the eighteenth through twenty-first aspects, the vent extends between a distal portion of the core volume and the location exterior to the housing, passing through the manifold.

The invention claimed is:

1. A liquid filtering apparatus comprising:

a bowl comprising an open end, a distal end opposite of the open end, and an interior that extends between the open end and the distal end;

a manifold that is capable of sealingly engaging the open end of the bowl, the manifold comprising a fluid inlet and a fluid outlet;

a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal;

a core volume at a central inner side of the cartridge assembly;

a housing volume at an outer side of the cartridge assembly between the cartridge assembly and the bowl; and a core vent extending through the manifold to a distal portion of the core volume to fluidly connect the distal portion of the core volume with an exterior of the liquid filtering apparatus such that the core vent comprises a conduit that has a first end and a second end, the first end is located at a distal portion of the core volume and the second end is located at the exterior, wherein the core vent is engaged with and secured as part of the cartridge assembly such that the core vent remains with the cartridge assembly upon disassembly of the cartridge assembly-manifold seal and removal of the cartridge assembly from the manifold.

2. The liquid filtering apparatus of claim 1, wherein:

the cartridge assembly has a central axis extending between the cartridge assembly proximal end and the cartridge assembly distal end, within the core volume, the cartridge assembly-manifold seal can be formed by pressing the cartridge assembly proximal end surface into contact with the surface of the manifold, with movement of the cartridge assembly along the central axis toward the manifold, and the cartridge assembly-manifold seal can be disassembled by pulling the cartridge assembly proximal end surface from the surface of the manifold, with movement of the cartridge assembly along the central axis away from the surface of the manifold.

3. The liquid filtering apparatus of claim 1, wherein the cartridge assembly includes a vent assembly that includes the core vent that extends from the proximal end of the cartridge assembly to the distal portion of the core volume.

4. The liquid filtering apparatus of claim 1, wherein the fluid inlet communicates with the housing volume, and the fluid outlet communicates with the core volume.

5. The liquid filtering apparatus of claim 1, wherein the core vent comprises a conductive material that electrically connects the core volume to electrical ground.

6. The liquid filtering apparatus of claim 1 installed in combination with a semiconductor manufacturing tool, to supply filtered liquid flowing from the fluid outlet to the semiconductor manufacturing tool.

7. A liquid filtering apparatus comprising:

a bowl comprising an open end, a distal end opposite of the open end, and an interior that extends between the open end and the distal end;

a manifold that is capable of sealingly engaging the open end of the bowl, the manifold comprising a fluid inlet and a fluid outlet;

a cartridge assembly disposed at the interior, the cartridge assembly comprising a filter membrane, a cartridge assembly proximal end, and a cartridge assembly distal end, the cartridge assembly proximal end including a surface that is adapted to contact a surface of the manifold to form a cartridge assembly-manifold seal;

an electrostatic discharge mitigation feature that comprises conductive polymer, that is capable of conducting electrical charge through a grounded circuit to inhibit accumulation of electrostatic charge within the apparatus;

a core volume at a central inner side of the cartridge assembly;

a housing volume at an outer side of the cartridge assembly between the cartridge assembly and the bowl; and a core vent extending between a distal portion of the core volume and a location exterior to the housing volume such that the core vent comprises a conduit that has a first end and a second end, the first end is located at a distal portion of the core volume and the second end is located at the exterior, passing through the distal end of the bowl, wherein the core vent is engaged with and secured as part of the cartridge assembly such that the core vent remains with the cartridge assembly upon disassembly of the cartridge assembly-manifold seal and removal of the cartridge assembly from the manifold and comprises a conductive polymer that is part of the grounded circuit to inhibit accumulation of electrostatic charge within the apparatus.

8. The liquid filtering apparatus of claim 7, wherein the core vent extends between the distal portion of the core volume and the location exterior to the house volume, passing through the manifold.

* * * * *